(12) United States Patent
Wilcox et al.

(10) Patent No.: US 7,539,958 B2
(45) Date of Patent: May 26, 2009

(54) ESTIMATION OF AVERAGE-CASE ACTIVITY FOR DIGITAL CIRCUITS

(75) Inventors: Stephen Paul Wilcox, Cambridge (GB); Simon Kinahan, Cambridge (GB); Ronald Ian Shipman, Baldock (GB)

(73) Assignee: Azuro (UK) Limited, Cambridge (GB)

( * ) Notice: Subject to any disclaimer, the term of this patent is extended or adjusted under 35 U.S.C. 154(b) by 151 days.

(21) Appl. No.: 11/149,938

(22) Filed: Jun. 10, 2005

(65) Prior Publication Data

US 2006/0282803 A1 Dec. 14, 2006

(51) Int. Cl.
*G06F 17/50* (2006.01)
(52) U.S. Cl. .............................................. 716/4; 716/5
(58) Field of Classification Search ..................... 716/1, 716/4–6, 18; 703/14–15
See application file for complete search history.

(56) References Cited

U.S. PATENT DOCUMENTS 6,345,379 B1 * 2/2002 Khouja et al. .................. 716/4

OTHER PUBLICATIONS

Marculescu et al. "Switching Activity Analysis Considering Spatiotemporal Correlations" Proceedings of the 1994 IEEE/ACM International Conference on 1994, pp. 294-299.

Najm "Transition density: A Stochastic Measure of Activity in Digital Circuits" 28th Design Automation Conference Jun. 1991.
T. Uchino et al. "Switching Activity Analysis using Boolean Approximation Method" In Proceedings of the ICCAD, pp. 20-25, Nov. 1995.
T. Uchino et al. "Switching Activity Analysis for Sequential Circuits Using Boolean Approximation Method" Proceedings of the 1996 International Symposium on Low Power Electronics and Design, p. 79-84, Aug. 12-14, 1996, Monterey, California, United States.

* cited by examiner

*Primary Examiner*—Paul Dinh
(74) *Attorney, Agent, or Firm*—Townsend and Townsend and Crew, LLP

(57) ABSTRACT

The present invention provides a method for estimating the average-case activity in a digital circuit. The method includes the steps of assigning initial activity values to outputs of flops in the digital circuit, and repeatedly updating the activity values in an iterative procedure until a predetermined termination criterion is met. The updating of the activity values uses a combination of standard probability updating techniques and predetermined formulae for obtaining the activity values of predesignated types of circuit elements in the digital circuit. The predesignated types of circuit elements include, for example, one or more of a clock-gated flop, an enable flop and a flop with a recirculation multiplexer.

20 Claims, 21 Drawing Sheets

| | Complex/Simple | Enable flop |
|---|---|---|
|  | simple | no |
|  | simple | no |
|  | complex | no |
|  | complex | yes |
|  | complex | yes |
|  | complex | no |

ESTIMATION OF AVERAGE-CASE ACTIVITY FOR DIGITAL CIRCUITS

BACKGROUND OF THE INVENTION

The present invention is related to the field of average-case activity estimation for digital circuits, such as CMOS circuits.

In order to save power, you must first be able to measure power. Dynamic power in ASICs depends on the switching activity, and leakage power depends on the current state of the circuit, so power estimation can be reduced to estimating the chance of switching and the typical level at each node in the circuit. Together, the switching and level information will be called activity information or just activity in this disclosure.

The most obvious way to find out the activity of a circuit is to use a logic simulator, together with a method for creating typical patterns on the top-level inputs, usually a test-bench written in a Register Transfer Language. This has a number of disadvantages. First, it is very time-consuming to create a good test-bench for the circuit. Second, simulation takes a long time. Third, the results are only applicable to the mode of use that the test-bench was created for. Other modes may have very different power signatures, and it is difficult to tell whether a particular test-bench is typical or not.

The main advantage of a simulation approach is that one can guarantee that the circuit has the calculated activity for one particular mode of use, although it is completely unknown whether the calculated activity is representative. To provide a much faster way to determine representative activities, techniques have been developed using stochastic methods. Early approaches were mostly focused on testing circuits rather than power estimation. These approaches did not consider correlations between signals or between the same signal at different times, so they were not accurate for typical circuits.

Other techniques that considered Markov chains capture a better correlation between the same signal at different times (a Markov chain is a standard technique for describing the evolution of stochastic systems). These techniques also suggest an approach for correlating between different signals, which improves accuracy, but this has been found to be slow.

Yet another technique includes a fast way to use correlations between signals, and then use a loop unrolling method to apply this to state machines. Although the algorithm for this technique works well for circuits with high degrees of re-convergent fan-out, it is a complicated algorithm.

Thus, there is a need for a simple and efficient algorithm for estimating the average-case activity in a digital circuit.

BRIEF SUMMARY OF THE INVENTION

In accordance with an embodiment of the invention a method for estimating the average-case activity in a digital circuit is as follows. Initial activity values are assigned to outputs of flops in the digital circuit. The activity values are updated repeatedly in an iterative procedure until a predetermined termination criterion is met. The updating of the activity values uses a combination of standard probability updating techniques and predetermined formulae for obtaining the activity values of predesignated types of circuit elements in the digital circuit.

In another embodiment, a user can specify activity values at any top-level input of the digital circuit, and any output of a circuit element in the digital circuit, and the specified activity values are used in preference to the activity values obtained by the iterative procedure.

In another embodiment, the iterative procedure searches for a recirculation multiplexer, and if a recirculation multiplexer is found, a predetermined formula is used to calculate the activity values at the output of a flop associated with the recirculation multiplexer using the activity values at inputs of both the flop and the recirculation multiplexer.

In another embodiment, the iterative procedure searches for a clock gated flop, and a clock gated flop is found, a predetermined formula is used to calculate the activity values at the output of the clock gated flop using the activity values at inputs of the clock gated flop.

In another embodiment, the iterative procedure searches for an enable flop, and if an enable flop is found, a predetermined formula is used to calculate the activity at the output of the enable flop using the activity at inputs of the enable flop.

In yet another embodiment, a first result obtained at the end of one iterative procedure is compared with the a second result at the end of the previous iterative procedure, and the updating of the activity values is terminated if any one of three conditions is met: (i) the first and second results are substantially similar, (ii) a predesignated time limit lapses, and (iii) a predesignated number of iterations in the iterative process is reached.

In another embodiment, the digital circuit is searched for a state machine. A predetermined formula is then used to calculate the activity values in the digital circuit at at least some nodes in the state machine.

In another embodiment, in searching for the state machine a feedback path from the output of a flop to either an input of a recirculation multiplexer through logic, if a recirculation multiplexer was found during the iterative procedure, or a D input of the flop, if no recirculation multiplexer was found and the flop has a D input is searched for.

In accordance with another embodiment of the invention, a computer system is configured to store a plurality of instructions for controlling a data processor to estimate the average-case activity in a digital circuit, wherein the plurality of instructions include instructions that cause the data processor to assign initial activity values to outputs of flops in the design, and instructions that cause the data processor to repeatedly update the activity values in an iterative procedure until a predetermined termination criterion is met. The updating of the activity values uses a combination of standard probability updating techniques and predetermined formulae for obtaining the activity values of predesignated types of circuit elements in the digital circuit.

The following detailed description and the accompanying drawings provide a better understanding of the nature and advantages of the present invention.

DETAILED DESCRIPTION OF THE INVENTION

In the following list, definitions are provided for specific terms appearing in this disclosure.

Combinational: logic which is stateless, that is, if inputs of the logic are held stable, the outputs of the logic will eventually settle to values which depend only on the current state of its inputs.

Flop (short for Flip-Flop): any kind of one-bit edge-triggered data storage device. Examples are D-type flip-flops, JK-type flip-flops, or latches with pulse-generator circuits to make them appear edge-triggered. Flops can be further subdivided into two categories:
1. Simple Flop: a D-type flip-flop (commonly called DFF), or any circuit that functions similarly (e.g., a transparent latch with pulse-generator circuits to make it appear edge-triggered).
2. Complex flop: a flop that isn't just a DFF, so there is a non-trivial expression for the next-state in terms of the current inputs. A DFF will have a next-state expression of just "D"—a complex flop may have a next-state expression of, for example, R.(E.D+not(E).Q), where R is a reset input, E is an enable input, D is the data input, and Q is the output.

Recirculation multiplexer: a multiplexer arranged on the input to a flop so that if a first signal takes a particular value, the state of the flop is held, but if the first signal takes the opposite value, the flop takes the value of a second signal.

Enable flop: a complex flop with an enable input. An example of an enable flop is a flop which includes a DFF and a recirculation multiplexer connected at its D input.

Clock gate: either a single gate or a number of gates in combination, which either pass or block a clock signal, depending on the state of an enable input. Like all other logic blocks, clock gates can have any or all of their input and output signals inverted.

Clock-gated flop: a flop that has a clock gate on the path from its clock input to the master clock.

Figure 1:
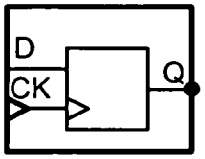
FIG. 1 shows exemplary flops illustrating the distinction between simple and complex flops, and between enable and non-enable flops.
Figure 1:
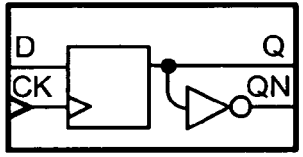
Figure 1:
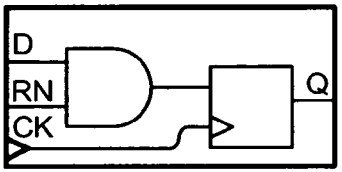
Figure 1:
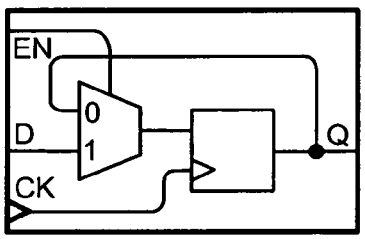
Figure 1:
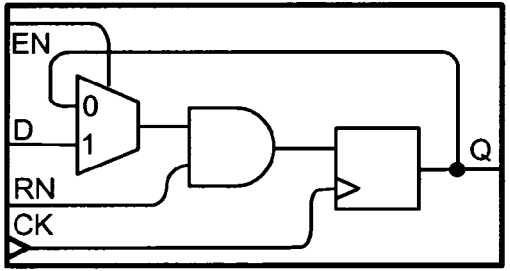
Figure 1:
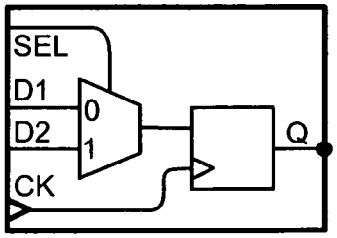
Figure 2:
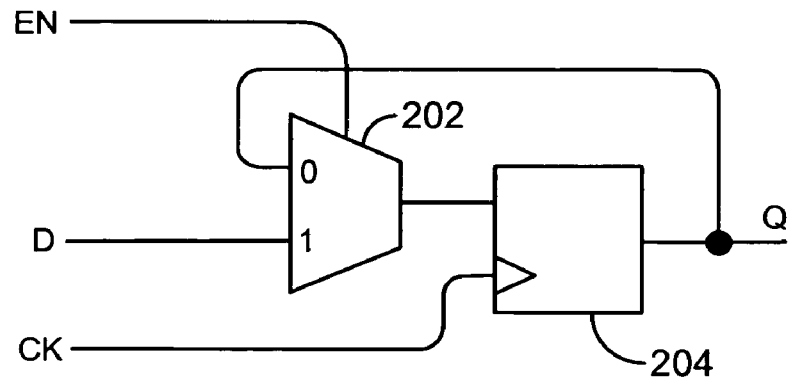
FIG. 2 shows an example of a multiplexer-flop configuration in which the multiplexer functions as a recirculation multiplexer.

FIG. 1 shows examples of flops provided to illustrate the distinction between simple and complex flops, and between enable and non-enable flops. FIG. 2 shows an example of a multiplexer 202/flop 204 configuration in which the multiplexer functions as a recirculation multiplexer. "Recirculation input" will be used hereinafter to reference the data input of a recirculation multiplexer that is logically equivalent to the output of the flop (i.e., input "0" of multiplexer 202 in FIG. 2), and "non-recirculation input" will be used hereinafter to refer to the other data input to the recirculation multiplexer (i.e., input "1" of multiplexer 202 in FIG. 2).

Figure 3:
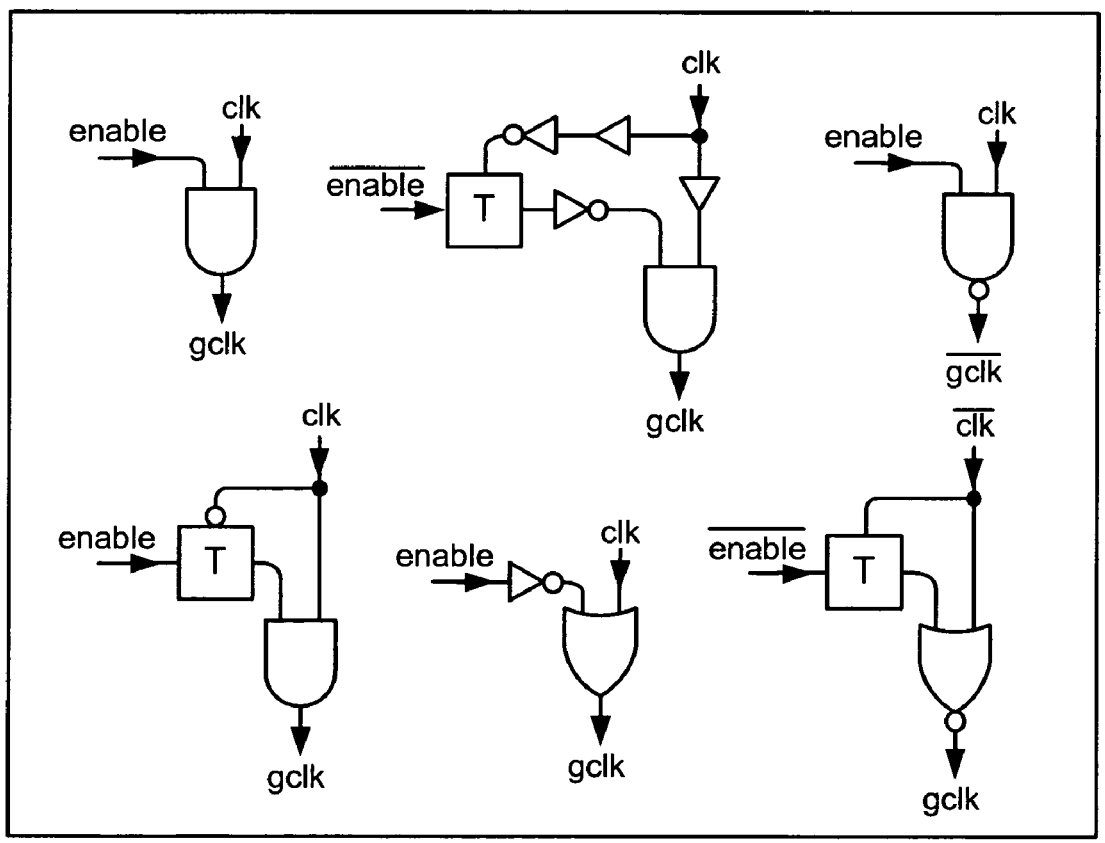
FIG. 3 shows few examples of clock gates.

FIG. 3 shows few examples of clock gates. The standard latch-AND combination is shown at the bottom left of FIG. 3, which gates the clock low if the enable signal is low, and is protected against transitions on the enable input if the clock is high. The other circuits show that clock gates can also have the enable or clk inputs inverted, the gclk output inverted, can gate the clock high in the "off" state, can have extra buffering logic inserted internally, and can dispose of the latch if the timing on the enable is known more precisely.

The data structures used in the present invention are described next. Each node in the design is classified as either being on a clock tree, or on the datapath. Gates between a clock root and the sinks of the clock tree (usually clock inputs of flops) inclusive are on the clock tree, and other gates are on the datapath. Each clock tree node is assigned a probability of being enabled, $p_{en}$, and a clock token, which indicates which clock tree the node belongs to. The gate that drives the clock root has $p_{en}=1$ by definition, and clock gates reduce the value of $p_{en}$ for gates they drive.

Each datapath node is assigned values $p_{hi}$ and $p_{sw}$, and a clock token (referred to hereinafter as "the triples"). The clock token is a reference to the highest frequency clock that can cause the node to switch. The value of $p_{hi}$ is the probability that the node is high (i.e., logic 1) at the significant edge of the clock referred to by the clock token. The value of $p_{sw}$ is the probability that the value of the node is different between two adjacent significant edges of the clock referred to by the clock token.

The activity problem is, in effect, finding good values for $p_{sw}$ at all datapath nodes and $p_{en}$ at all clock tree nodes, but because $p_{sw}$ for a gate depends on the $p_{hi}$ values of its driving gates, we need to find $p_{hi}$ for all nodes on the datapath as well.

In this disclosure $x_{sw}$, $x_{hi}$ and $x_{en}$ are used as abbreviations for "$p_{sw}$ at node X", "$p_{hi}$ at node X" and "$p_{en}$ at node X" respectively, for any node X in the circuit. A probability propagation technique used to obtain activity values for combinational logic will be described next.

I. Probability Propagation for Combinational Logic

Figure 4A:
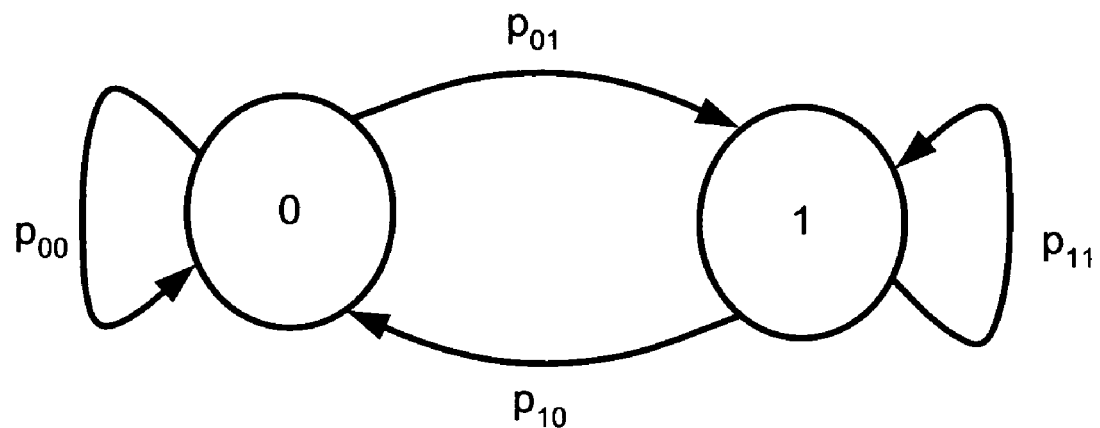
FIG. 4A shows a discrete time Markov chain.

The basic correspondence underlying all of the probability propagation code is between a Markov model of a binary random source, as in FIG. 4A, and a pair of numbers $p_{hi}$ and $p_{sw}$ representing the probability that a node is high and the probability that it switches, respectively. It is assumed that the model in FIG. 4A can only switch at positive edges of the clock, so is a discrete time Markov chain. It is also assumed that the value of $p_{sw}$ is not zero and $p_{hi}$ is not 0 or 1. We define $p_1$ as the steady-state probability that it is in state 1, and $p_0$ as the steady-state probability that is it in state 0. The value of $p_1$ is therefore $p_{hi}$, and $p_0$ is $1-p_{hi}$.

Define $p_{jk}$ as $P(X_{n+1}=k|X_n=j)$ and $P_{jk}$ as $P(X_n=j, X_{n+1}=k)$. Using standard techniques, we find that:

$$p_{01}=p_{sw}/\{2(1-p_{hi})\}$$

$$p_{00}=1-p_{01}$$

$$p_{10}=p_{sw}/(2p_{hi})$$

$$p_{11}=1-p_{10}$$

and $$P_{00}=P(X_n=0, X_{n+1}=0)=p_0p_{00}=1-p_{hi}-\tfrac{1}{2}p_{sw}$$

$$P_{01}=P(X_n=0, X_{n+1}=1)=p_0p_{01}=\tfrac{1}{2}p_{sw}$$

$$P_{10}=P(X_n=1, X_{n+1}=0)=p_1p_{10}=\tfrac{1}{2}p_{sw}$$

$$P_{11}=P(X_n=1, X_{n+1}=1)=p_1p_{11}=p_{hi}-\tfrac{1}{2}p_{sw}$$

where $X_n$ is the state of the Markov chain at time step n.

Figure 4B:
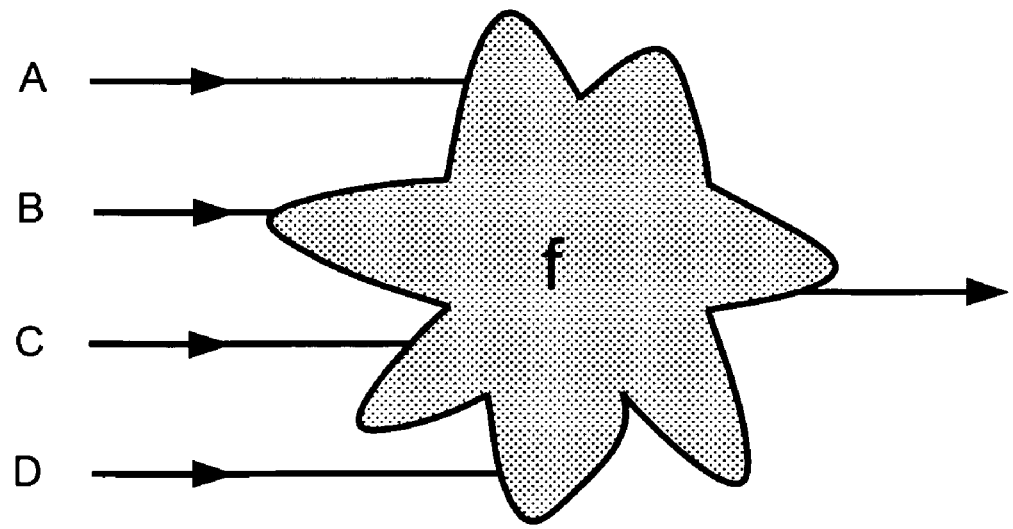
FIG. 4B depicts a 4-input gate.

The value of $P_{yz}$ for node X is abbreviated as $X_{yz}$, the value of $p_{yz}$ for node X is abbreviated as $x_{yz}$, and the value of $p_y$ for node X is abbreviated as $x_y$, for appropriate values of y and z. Considering the four-input gate in FIG. 4B, there are sixteen different input combinations, some of which cause the output to be high and some cause it to be low. If $p_{hi}$ is known for each of the inputs (naming them $a_{hi}$, $b_{hi}$, $c_{hi}$ and $d_{hi}$), then $p_{hi}$ could be found for the output by simply adding up the probabilities for each input combination. For example, if the output is high when ABCD=0000, 0010 and 0001, then $p_{hi}$ would be $a_0b_0c_0d_0+a_0b_0c_1d_0+a_0b_0c_0d_1$, with (as above) $a_0=1-a_{hi}$ and $a_1=a_{hi}$, and the same for the b's, c's and d's.

The $p_{sw}$ for the output could be found by looking at all input switching combinations. For example, the input combination 0000→0011 causes an output switch, because the output is high for the input 0000, but low for the input 0011. The probability of the switch 0000→0011 can be calculated as:

$P(A$ was 0, goes to 0$).P(B$ was 0, goes to 0$).$ $P(C$ was 0, goes to 1$).P(D$ was 0, goes to 1$) =$ $P(A_n = 0, A_{n+1} = 0).P(B_n = 0, B_{n+1} = 0).P(C_n = 0, C_{n+1} = 1).$ $P(D_n = 0, D_{n+1} = 1) = A_{00}B_{00}C_{01}D_{01}$ This assumes independence of A, B, C, and D, which is not necessarily true, but is a good approximation in the majority of circuits. This can now be calculated in terms of $a_{hi}$, $a_{sw}$, $b_{hi}$ ... $d_{sw}$. This is just one transition, so the values for all possible transitions can be added to get the final value of $p_{sw}$ for the output. It is a straightforward extension of this approach to use Binary Decision Diagram (BDD) for the function $f$ to greatly reduce the amount of work that needs to be done (BDDs are standard techniques for storing and manipulating Boolean expressions). The BDD effectively gives a non-overlapping series of expressions for the conditions on $f$ to be high or low. In this case, the BDD could well give:

$f$ high if $ABCD$=000$X$ or 0010

$f$ low if $ABCD$=1$XXX$ or 01$XX$ or 0011

By considering only transitions between states where $f$ is low and states where $f$ is high, there are only six terms in the expression for $p_{sw}$, rather than the total number of switching transitions, which is 3×13 high and 13×3 low equaling 78 in total.

The above approach can be used whenever activity values need to be propagated through combinational logic. If the inputs to a gate have different clock tokens, the values of $p_{sw}$ should be adjusted to the highest frequency input clock by a simple linear scaling, and the output node should have the highest frequency clock token. There are three cases where the above probability propagation technique does not apply:

Buffers and inverters on the clock tree. These have $p_{en}$ values instead of $p_{hi}$ and $p_{sw}$ values. The value of $p_{en}$ is simply propagated unchanged to the output.

Clock Gates. A clock gate has a clock input, an enable input, and a gated clock output. The clock input is on the clock tree, so it does not have $p_{sw}$ and $p_{hi}$ values—it has a $p_{en}$ value instead. The value of $p_{en}$ for the gated clock output is $e_{hi} \cdot p_{en}$, where $e_{hi}$ is the value of $p_{hi}$ on the enable input.

Flops. The above algorithm can be used to propagate activity values through any logic inside the flop until you get to the state-holding element. To calculate the value of $p_{hi}$ and $p_{sw}$ on the output of the flop, the First Technique described below needs to be used.

II. Obtaining the Average-Case Activity for Recirculation Multiplexers, Enable Flops, and Clock-Gated Flops (First Technique)

Clock gates act to reduce the switching activity on the clock tree. Recirculation multiplexers on the datapath and enable inputs of enable flops act in the same way as far as the switching output of a gate is concerned. In accordance with an embodiment of the invention, an algorithm identifies clock-gated flops, recirculation multiplexers, and enable flops, and then propagates activity values through them using a formula derived from the model of an enable flop shown in FIG. 5A. Derivation of the formula is described first.

Figure 5A:
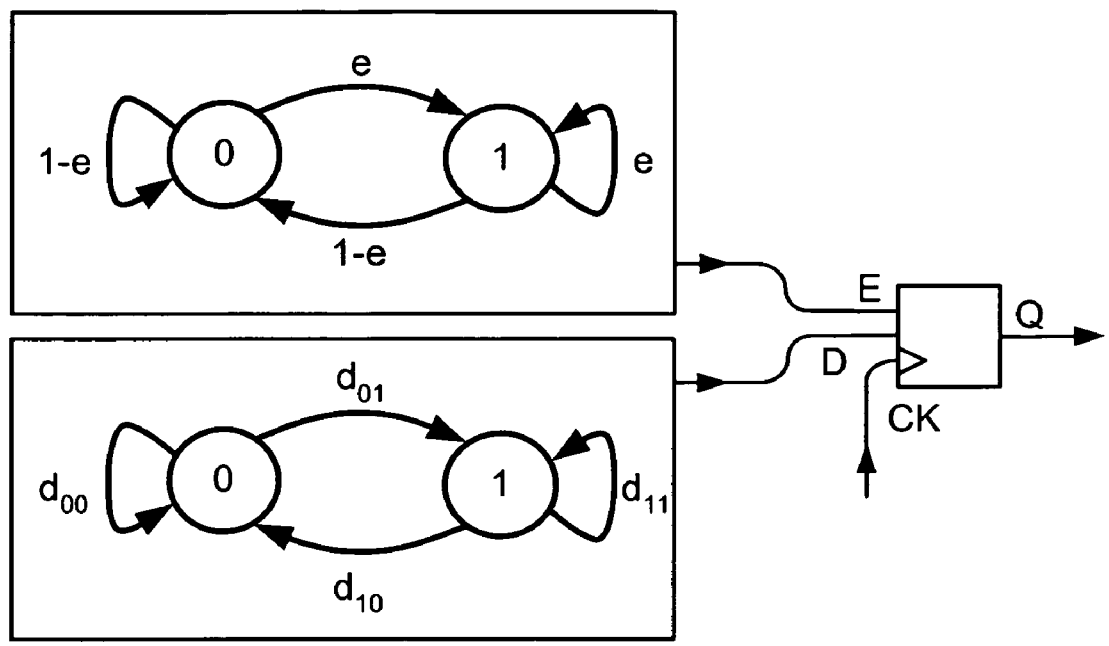
FIGS. 5A and 5B show a model of an enable flop and a corresponding Markov chain, respectively.
Figure 5B:
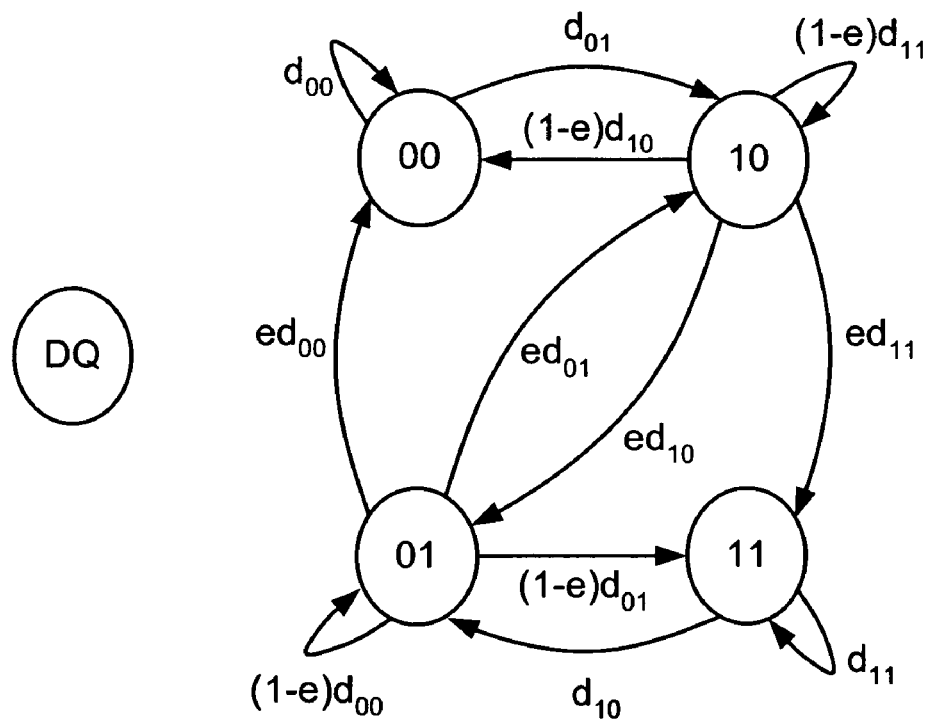

It is believed that all three of clock-gated flops, recirculation multiplexers, and enable flops act in the same way, so that a formula derived from a model of an enable flop (FIG. 5A) applies to all three. In FIG. 5A, the value of enable input E is stateless (i.e., transitions from 0 and 1 states to state 1 occur with the same probability), so a Markov chain for the data input D, output Q and enable input E of the flop need not consider the state of enable input E. This leads to the Markov chain in FIG. 5B. By calculating the stationary distribution of the Markov chain in FIG. 5B, assuming the usual properties for the existence of such a distribution, the following formula (hereinafter referred to as "Formula 1 ") from which the $p_{sw}$ and $p_{hi}$ values for the output of the flop can be calculated is obtained:

$$q_{hi}=d_{hi}$$

$$q_{sw}=2ed_{sw}d_{lo}d_{hi}/\{2ed_{lo}d_{hi}+(1-e)d_{sw}\}; \text{ where } d_{lo}=1-d_{hi}$$

Formula 1 is used whenever an enable flop, clock-gated flop or recirculation multiplexer is encountered as described next. The flow chart in FIG. 6 will be used to describe the method by which a recirculation multiplexer on the input of a flop is identified. In step 602, the inputs of the flop are searched to determine whether they include a D input.

If a D input is not found, then there is no point searching for a multiplexer since such multiplexer would not be a recirculation multiplexer, and as indicated in step 620, standard propagation algorithms are used instead. But, if a D input is found, then as indicated in step 606, the gate driving the D input is evaluated to determine whether it has 3 inputs (as would a 2-1 multiplexer). If it does not, then the gate is not a recirculation multiplexer and standard propagation algorithms are used instead (step 620). But, if the gate driving the D input of the flop has three inputs, then as indicated in step 610, the expression for the output of the gate (i.e., f(A,B,C) where A, B and C represent the three inputs to the gate) is obtained.

In Step 612, it is determined whether any of the gate inputs A, B and C is logically equivalent to the flop output Q. If none are equivalent, then the gate is not a recirculation multiplexer and standard propagation algorithms are used instead (step 620). But, if one of the three gate inputs is equivalent, then as indicated in step 616, in the above expression for f, the input of the gate which is equivalent to Q is substituted with Q and variables S and T are substituted for the other two gate inputs, and the new expression for f is then checked against the following four expressions:

If $f(Q,S,T)=Q.S+\text{not}(S).T$, then not($S$) is an enable input and $T$ is a data input. (1)

If $f(Q,S,T)=Q.\text{not}(S)+S.T$, then $S$ is an enable input and $T$ is a data input. (2)

If $f(Q,S,T)=Q.T+S.\text{not}(T)$, then not($T$) is an enable input and $S$ is a data input. (3)

If $f(Q,S,T)=Q.\text{not}(T)+S.T$, then $T$ is an enable input and $S$ is a data input. (4)

If the new expression for f does not match any of the above four expressions, then the gate is not a recirculation multiplexer and standard propagation algorithms are used instead (step 620). But, if a match is found, the enable and data inputs are identified in accordance with the matching expression, and the gate is labeled as a recirculation multiplexer. As indicated in step 622, the activity values at the flop output Q are then calculated using Formula 1 wherein q, d, and e correspond to the flop output, a data input of the multiplexer, and the enable input of the multiplexer, respectively. While the technique in FIG. 6 would not recognize a multiplexer with its output coupled to the D input of the flop through some logic (as opposed to a direct connection) as a recirculation multiplexer, modifying the flow chart in FIG. 6 so that such multiplexers are also identified and labeled as recirculation multiplexer would be obvious to one skilled in this art.

Figure 6:
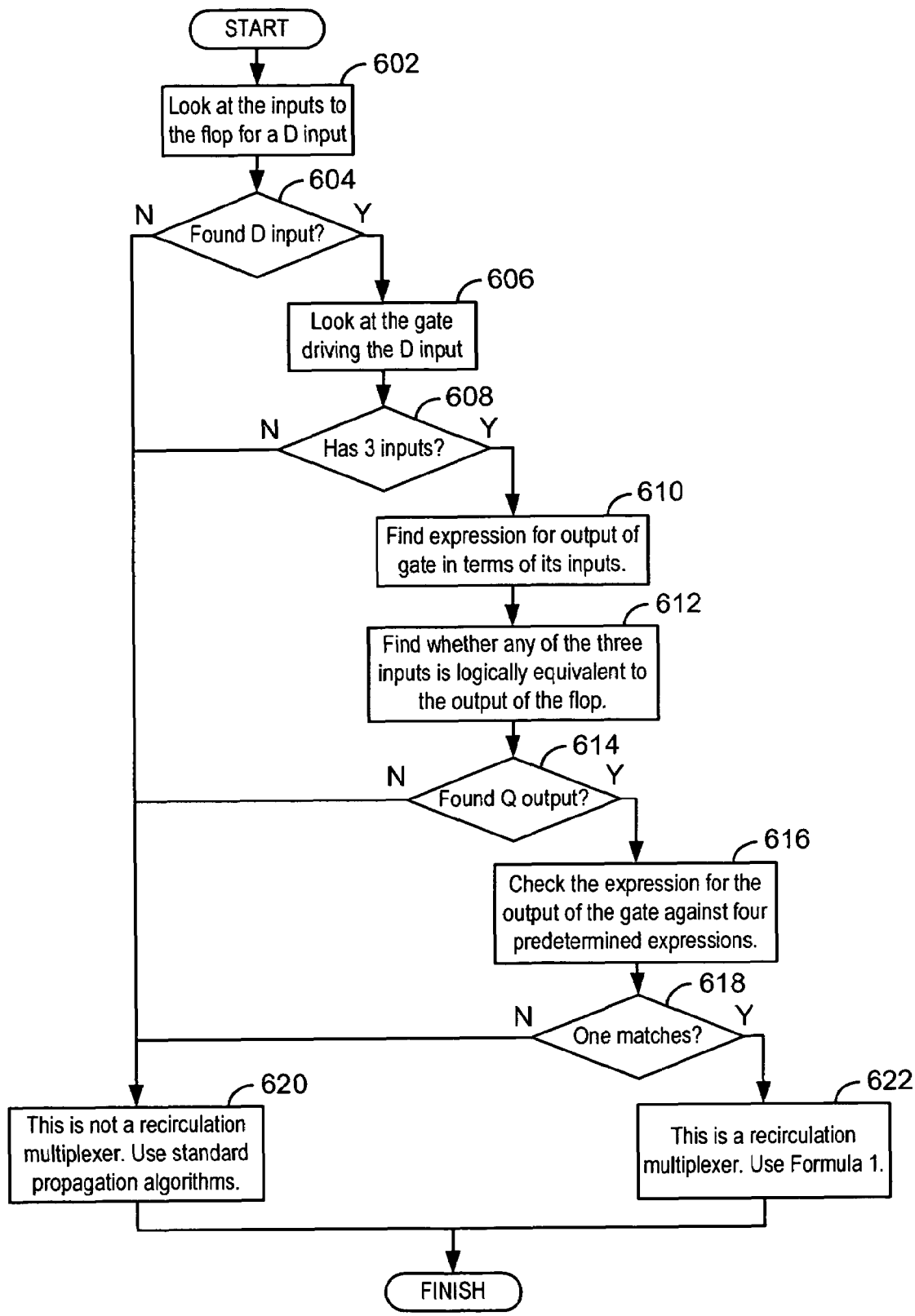
FIG. 6 is a flow chart illustrating the method by which a recirculation multiplexer on the input of a flop is identified in a circuit, in accordance with an embodiment of the invention.
Figure 7:
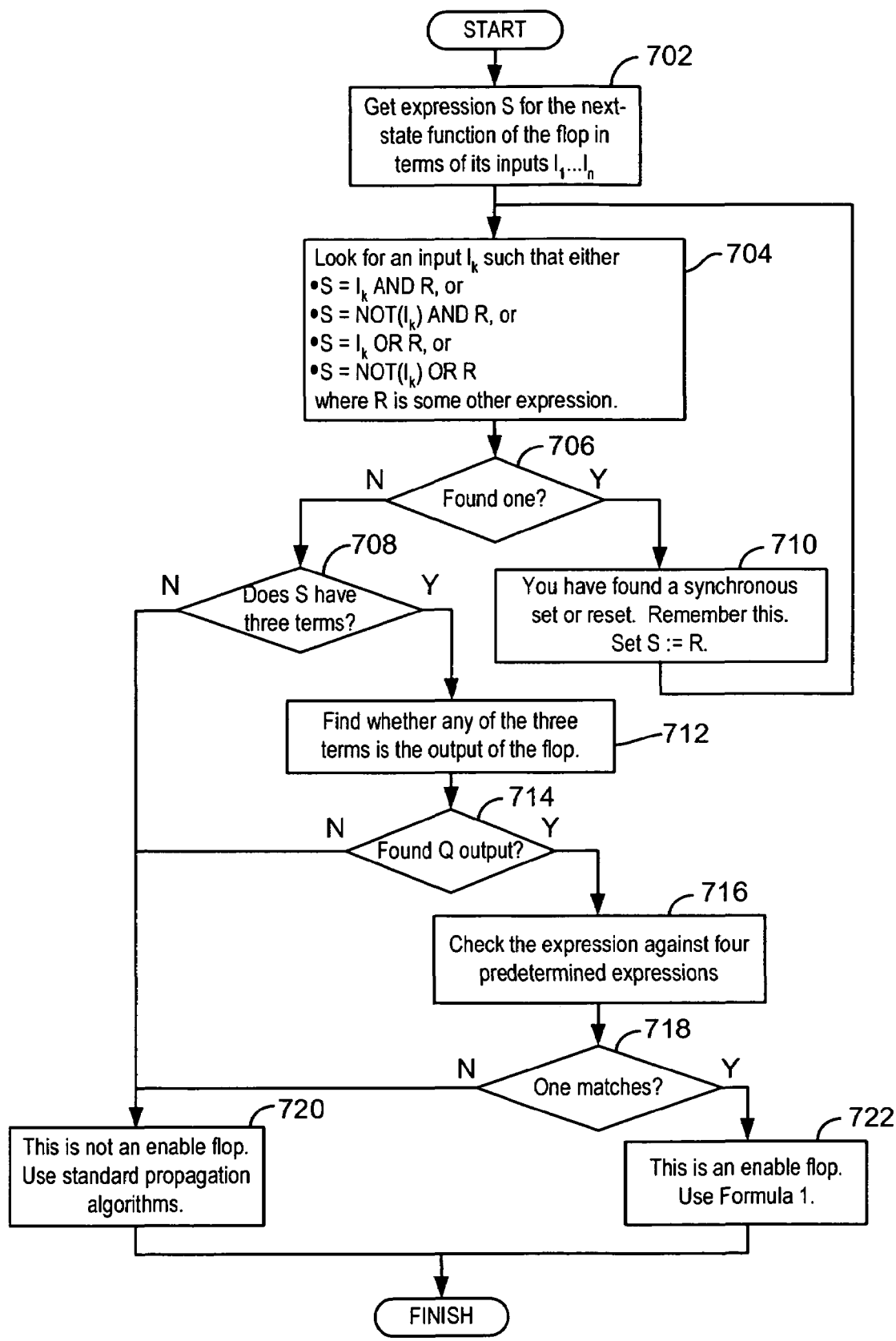
FIG. 7 is a flow chart illustrating the method by which an enable flop is identified in a circuit, in accordance with an embodiment of the invention.

A similar technique to that in FIG. 6 may be used on the expression inside a complex flop to determine whether the complex flop is an enable flop, except that the procedure is made slightly complicated by having to first find synchronous reset or set inputs. The flow chart in FIG. 7 will be used to describe the technique for determining whether a complex flop is an enable flop. Initially, the circuit is searched to determine whether it includes a flop with more than two inputs (i.e., a complex flop). If one is found, then as indicated in step 720, an expression S is obtained for the next-state function of the flop in terms of its input $I_1, I_2, \ldots I_n$. In step 704, it is determined whether an input $I_k$ or its complement NOT($I_k$) can be found that satisfies any of the following:

$S=I_k$ AND R (1)

$S=\text{NOT}(I_k)$ AND R (2)

$S=I_k$ OR R (3)

$S=\text{NOT}(I_k)$ OR R (4)

Where R is some logic expression. If such an input is found, then as indicated by step 710, input $I_k$ is labeled as a synchronous set or reset input and this information is retained, and expression S is updated to be the same as expression R. The algorithm then loops back to determine whether any of the remaining inputs of the flop satisfy any of four updated expressions. This loop is repeated until the terms corresponding to the set and reset inputs are eliminated from expression S.

Once set and reset terms (if any) are eliminated from expression S, it is then determined whether expression S has three terms as indicated in step 708. If the expression S is found to include more or less than 3 terms, then the flop is not recognized as an enable flop, and as indicated in step 720, standard propagation algorithms are used instead. If expression S is found to have three terms, then as indicated in step 712, it is determined whether any of the three terms in expression S is the flop output Q. If not, then the flop is not recognized as an enable flop and standard propagation algorithms are used instead (step 720). But, if one of the three terms is Q, then as indicated in step 716, the expression S is checked against the four expressions referenced in step 616 in FIG. 6. If expression S does not match any of the four expressions, then the flop is not recognized as an enable flop and standard propagation algorithms are used instead (step 720). But, if a match is found, the flop is labeled as an enable flop. As indicated in step 722, the activity values at the flop output Q are then calculated using Formula 1 wherein q, d, and e correspond to the flop output, a data input of the flop, and the enable input of the flop, respectively.

Clock-gated flops are identified as follows. Initially, the circuit is searched to find all flops. The root node of a clock tree has $p_{en}=1$. This is propagated through the clock tree using standard probability propagation techniques to find the $p_{en}$ value at the clock inputs to all flops in the design. Those flops which do not have a $p_{en}$ value of 1 on their clock input are labeled as clock-gated flops. The activity values at the output Q of the clock-gated flops are then calculated using Formula 1. The algorithms represented by the flow charts in FIGS. 6 and 7 and any variations thereof are hereinafter referred to as the First Technique.

III. Obtaining the Average-Case Activity for a Digital State Machine (Second Technique)

The probability-propagation approach is not suitable for obtaining the average-case activity for state machines (including such special cases as counters and incrementers) because it can give incorrect results. This is because the next state of the flops in a state machine is highly dependent on the current state, but the probability propagation approach assumes independence of all inputs to a logic gate. A computationally efficient technique represented by the flow chart in FIG. 8, in accordance with an embodiment of the invention, produces good results on state machines. The probabilities obtained using this technique correlate well with measured probabilities for a variety of test circuits.

In step 802, all flops where the output directly affects the input are identified, but those flops where the output affects the input only through a recirculation multiplexer are excluded. While the technique in FIG. 8 can be used on flops where the output affects the input only through recirculation multiplexer, better results are obtained using the First Technique on such flops. Thus, step 802 in effect identifies every flop which has its output coupled to an input of a logic block whose output is in turn coupled to the D input of the flop either directly or through a recirculation multiplexer (such logic block is hereinafter referred to as "feedback logic"). This is more clearly illustrated in the exemplary logic circuit shown in FIG. 9.

Figure 9:
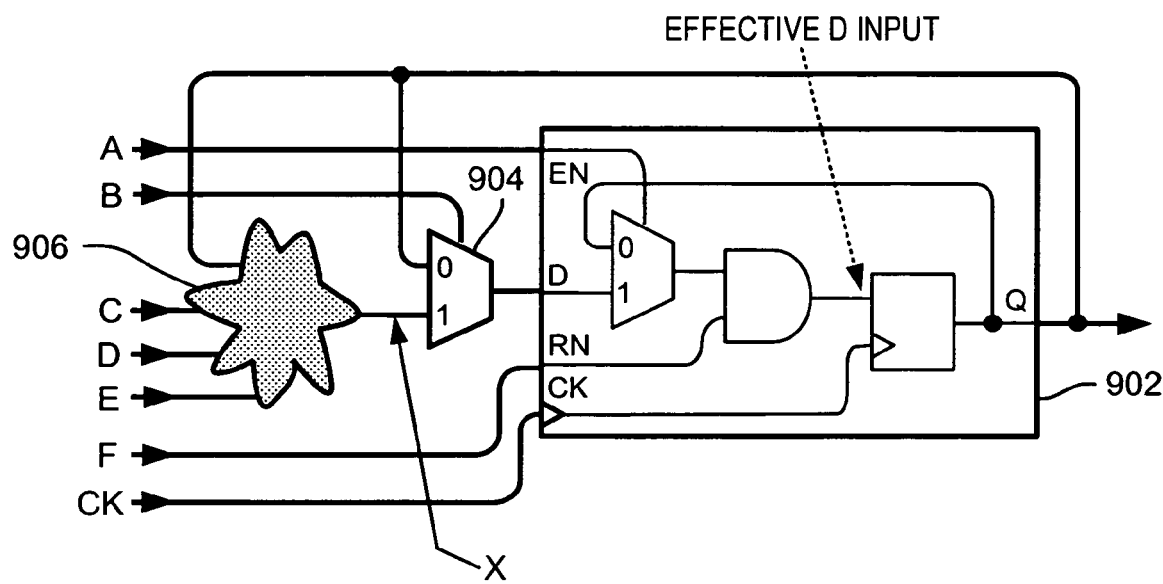
FIG. 9 shows an exemplary logic circuit used in describing the various techniques disclosed herein.

In FIG. 9, a flop 902 with built-in enable and reset has its output Q coupled to both an input of a logic block 906 and the recirculation input of a recirculation multiplexer 904. An output of logic block 906 is coupled to the non-recirculation input of recirculation multiplexer 904. Since flop 902 fits the criterion in step 802, it would be identified in step 802. In the case where the recirculation multiplexer 904 is removed and the output of logic block 906 is directly connected to the D input of flop 902, flop 902 would also be identified in step 802. If the output of flop 902 was connected to its D input only through recirculation multiplexer 904 (i.e., the flop output was not connected to an input of logic block 906), then flop 902 would not be identified in step 802.

Referring back to FIG. 8, in step 804, the $p_{hi}$ and $p_{sw}$ values at the output Q of the identified flop are both set to 0 (i.e., $q_{hi}=0$, $q_{sw}=0$), and $p_{hi}$ and $p_{sw}$ values at the output X of the feedback logic are calculated using the standard probability propagation technique. Variables $H_0$ and $S_0$ are set equal to the calculated values $p_{hi}$ and $p_{sw}$ at output X of the feedback logic (i.e., $S_0=x_{sw}$ and $H_0=x_{hi}$). In step 806, the $p_{hi}$ and $p_{sw}$ values at the flop output Q are respectively set to 1 and 0 (i.e., $q_{hi}=1$, $q_{sw}=0$), and the $p_{hi}$ and $p_{sw}$ values at output X of the feedback logic are calculated again. Variables $H_1$ and $S_1$ are set equal to the newly calculated values $p_{hi}$ and $p_{sw}$ at output X (i.e., $S_1=x_{sw}$ and $H_1=x_{hi}$). Variable $S_0$ and $H_0$ indicate how likely the output of the flop is to switch away from 0, and variables $S_1$ and $(1-H_1)$ indicate how likely the output of the flop is to switch away from 1.

Figure 10:
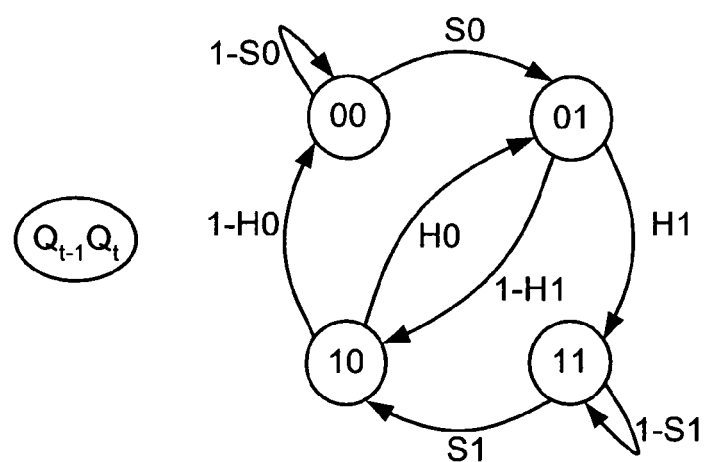
FIG. 10 is a Markov chain used to obtain the activity values at a node in a state machine.

The Markov chain in FIG. 10 is an approximation to the behavior of a flop in terms of the current state $Q_t$ and the next state $Q_{t+1}$, derived from the case where there is no recirculation multiplexer and the flop is a simple flop. In this restricted case, $d_{hi}=q_{hi}$ and $d_{sw}=q_{sw}$. In step 808, variable $S_0$ is limited to the range $\delta \leq S_0 \leq H_0$, and $S_1$ to the range $\delta \leq S_1 \leq (1-H_1)$ to make the Markov chain shown in FIG. 10 recurrent. The value of $\delta$ (delta) should be a number substantially close to but not zero (e.g., 0.01). By calculating the stationary distribution of the Markov chain in FIG. 10, assuming the usual properties for the existence of such a distribution, the following formula (hereinafter referred to as "Formula 2") can be obtained for $p_{sw}$ and $p_{hi}$ values at the output of the flop, which by the above observation, also apply at the output of the recirculation logic 906:

$$p_{sw} = \frac{2S_0 S_1}{S_1(1-H_0) + 2S_0 S_1 + H_1 S_0}$$

$$p_{hi} = \frac{S_0(S_1 + H_1)}{S_1(1-H_0) + 2S_0 S_1 + H_1 S_0}$$

Figure 8:
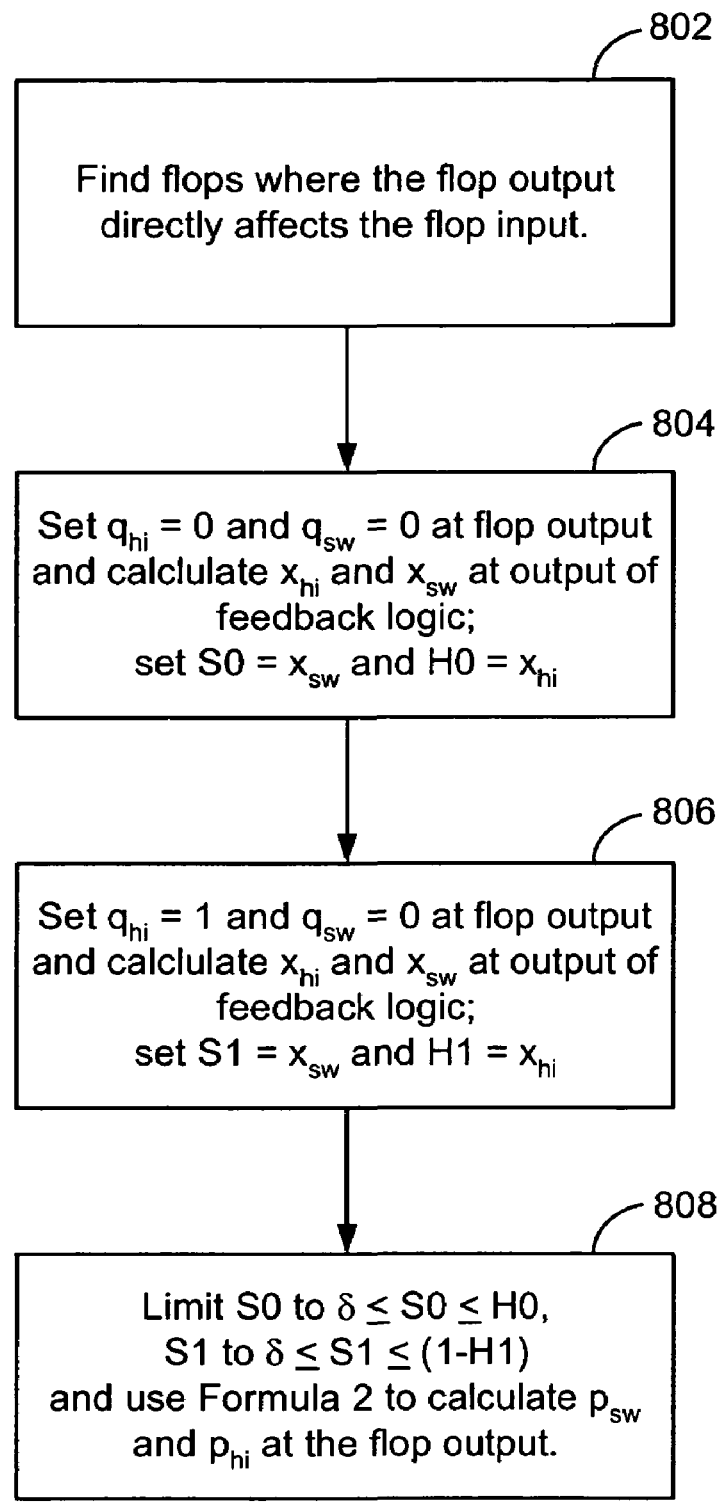
FIG. 8 is a computationally efficient technique for identifying state machines in a circuit and obtaining activity values at a node in the sate machine, in accordance with an embodiment of the invention.

In the general case shown in FIG. 9, Formula 2 is used to find the values of $p_{sw}$ and $p_{hi}$ at point X. The technique illustrated in FIG. 8 gives excellent results on a range of state machine circuits where a simple probability approach would be highly inaccurate. The algorithm represented by the flow chart in FIG. 8 and any variations thereof will hereinafter be referred to as "the Second Technique."

IV. Technique for Generating Statistical Information about the Circuit (Method A)

In accordance with another embodiment of the invention, a probability updating technique (hereinafter referred to as "Method A") is used to generate statistical information about a circuit. The statistical information can be used in a number of applications, for example, digital circuit power estimation.

In method A, initially, activity pairs ($p_{en}$, clock token) are assigned to all clock tree nodes and triples ($p_{hi}$, $p_{sw}$, clock token) are assigned to all datapath nodes in the circuit. Triples must be given by the user for all top-level inputs and outputs of black-boxes in the design, or a default value may be used. A possible default value for the triples is 0.5, 0.1, highest frequency clock. Starting values are also assumed for all flops and other state-holding elements in the circuit, and then a probability updating algorithm is repeated until all values of $p_{en}$, $p_{hi}$ and $p_{sw}$ have converged to a suitable level of accuracy (e.g., 0.01). Convergence can be measured by standard statistical tests. The starting values for $p_{en}$, $p_{hi}$ and $p_{sw}$ may be 0.5, but the final activity for almost all nodes does not depend on the initial values, so the starting values are largely arbitrary.

Figure 11:
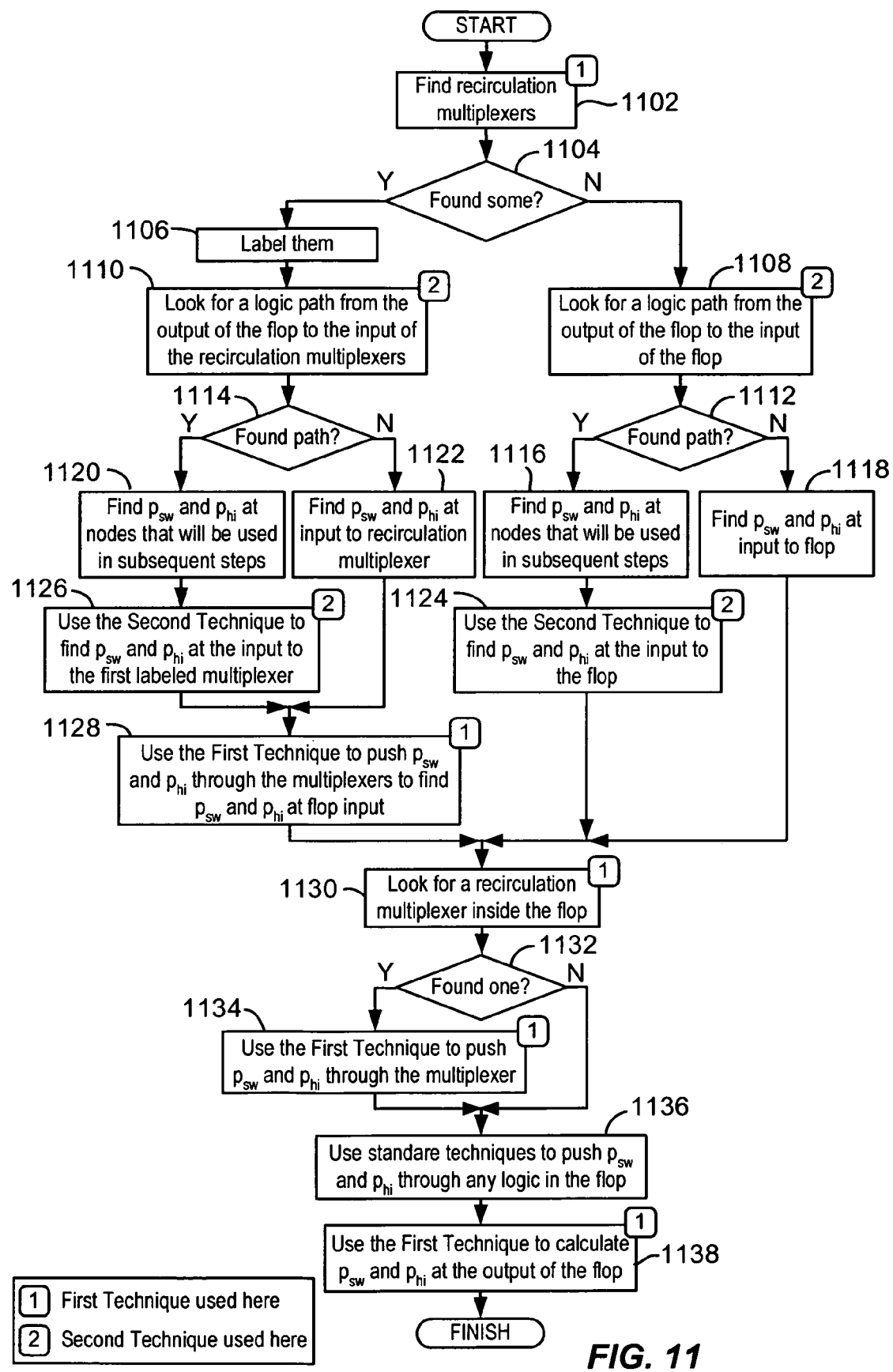
FIG. 11 is a flow chart illustrating a probability updating technique for generating statistical information about a circuit, in accordance with an embodiment of the invention.
Figure 12:
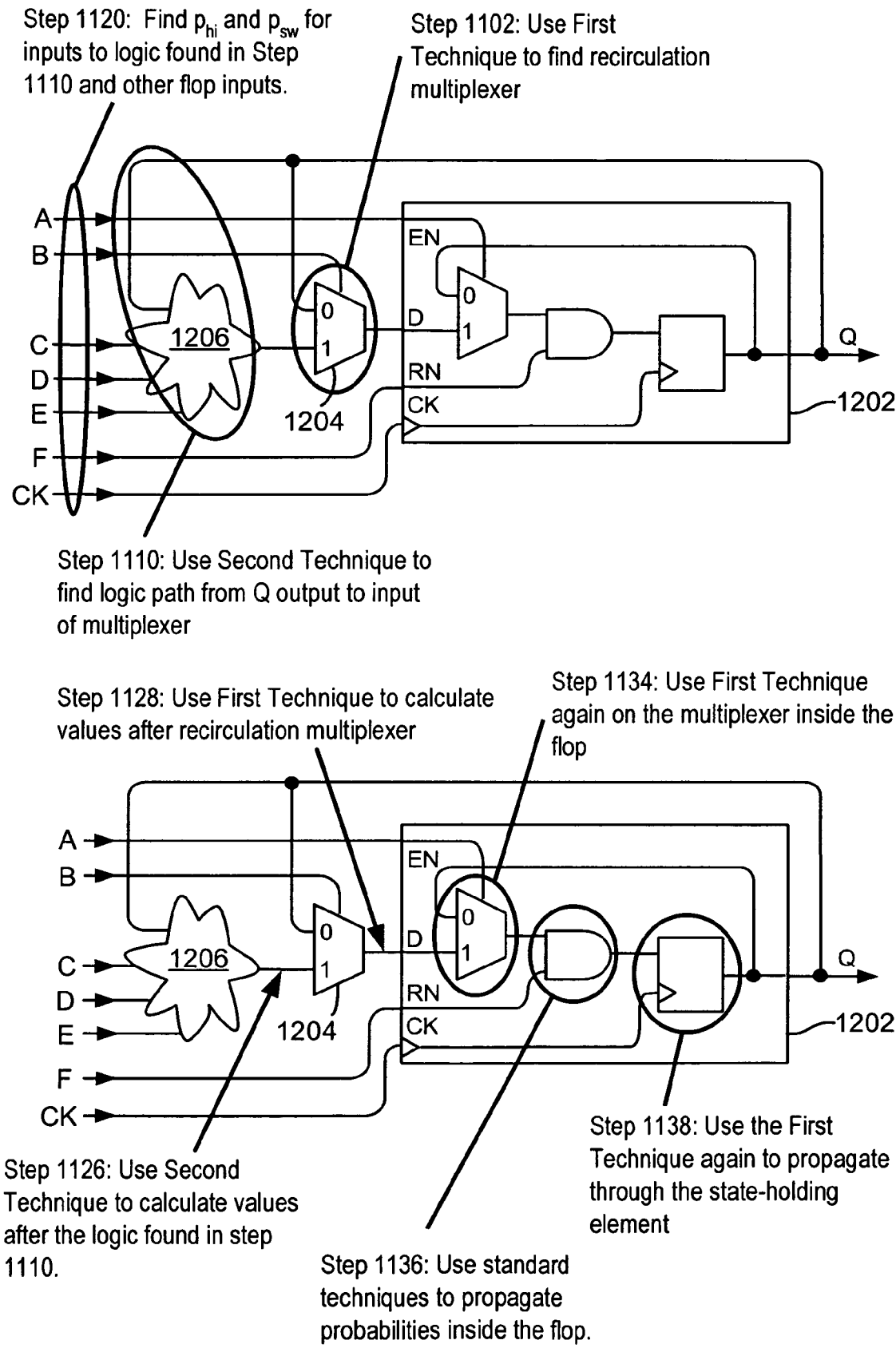
FIG. 12 shows an exemplary logic circuit used in describing the probability updating technique shown in FIG. 11.

The flow chart in FIG. 11 will be used together with the diagrams in FIG. 12 to describe the probability updating algorithm (Method A) in more detail. FIG. 12 includes an exemplary logic circuit which is identical to the logic circuit in FIG. 9.

Initially, the circuit is searched to identify any flops. If no flop is found, standard propagation algorithms are used on the circuit. If a flop is found, then the flow chart in FIG. 11 is used. In step 1102, the First Technique is used to search the circuit for a recirculation multiplexer at an input of the flop. If a recirculation multiplexer (e.g. multiplexer 1204 in FIG. 12) is found, the steps along the left side of the flow chart are carried out, and if no recirculation multiplexers are found, the steps along the right side of the flow chart are carried out. Assuming no recirculation multiplexers are found, in step 1108 the Second Technique is used to search the circuit for a logic path from the output of the flop to its input. If such logic path is not found, then in step 1118, standard techniques are used to calculate the activity values at the input of the flop. If such logic path is found then as indicated in step 1116, the activity values at nodes that will be used in subsequent steps are calculated using conventional techniques. In step 1124, the Second Technique is used to obtain the activity values at the output of logic block 1206. Assuming the circuit in FIG. 12 is modified to eliminate multiplexer 1204, and the output of logic block 1206 is then directly connected to the D input of flop 1202, then in such circuit, step 1116 would result in obtaining activity values at inputs C, D, and E of logic block 1206, and step 1124 results in obtaining the activity values at the D input of flop 1202.

Referring back to step 1104, if a recirculation multiplexer is found (e.g., multiplexer 1204 in FIG. 12), then as indicated in step 1110, the Second Technique is used to search for a logic path from the output Q of the flop to the non-recirculation input of the recirculation multiplexer. If such logic path is not found, then as indicated in step 1122, the activity values at the non-recirculation input of the multiplexer are found using conventional techniques. Assuming the circuit in FIG. 12 is modified to eliminate logic block 1206, then in such circuit, step 1122 would result in obtaining the activity values at the "1" input of multiplexer 1204.

If in step 1110, a logic path from the output Q of the flop to the non-recirculation input of the recirculation multiplexer is found, then as indicated in step 1120, the activity values at the input of the identified logic and at other flop inputs (e.g., inputs A-F and CK input in FIG. 12) are calculated using conventional techniques. Step 1120 is illustrated in FIG. 12. Then, as indicated in step 1126, the Second Technique is used to obtain the activity values at the non-recirculation input of the recirculation multiplexer. Step 1126 is illustrated in FIG. 12.

In step 1128, using the First Technique, the activity values at the non-recirculation input of the recirculation multiplexer obtained at either step 1126 or step 1122 are pushed through the recirculation multiplexer to obtain the activity values at the output of the recirculation multiplexer. This step is illustrated in FIG. 12. In step 1130, using the First Technique, the identified flop is searched to determine whether it includes a recirculation multiplexer (i.e., is an enable flop). If a recirculation multiplexer is found, then as indicated in step 1134, the First Technique is used to obtain the activity values at the output of the recirculation multiplexer inside the flop. Step 1134 is illustrated in FIG. 12.

In step 1136, the previously calculated activity values including those obtained at the multiplexer output in step 1134 or those at the input of the flop (in the case where no recirculation multiplexer is found inside the flop) are pushed through to the effective D input of the flop. Step 1136 is illustrated in FIG. 12. In step 1138, the First Technique is used to calculate the activities at the flop output using the activity values at the effective D input of the flop and the $p_{en}$ for the clock input CK. Step 1138 is illustrated in FIG. 12. Steps 1102-1138 are carried out for each flop in the circuit.

For efficiency reasons, some of the steps may be carried out outside the loop. For example, the recirculation multiplexers for all flops could be found in one step and the information stored in a table where it could be accessed as needed. As can be seen, the steps in FIG. 11 are complicated by the fact that each flop in the design: (1) may or may not have a recirculation multiplexer on its input, (2) may or may not have an implicit recirculation multiplexer (that is, may or may not be an enable flop), (3) may or may not have extra internal logic (such as synchronous resets or non-recirculation multiplexers), and (4) may or may not have one or more combinational paths from its output to its input. This means there are effectively sixteen cases to consider. The flow chart in FIG. 11 takes all sixteen cases into account.

Figure 13:
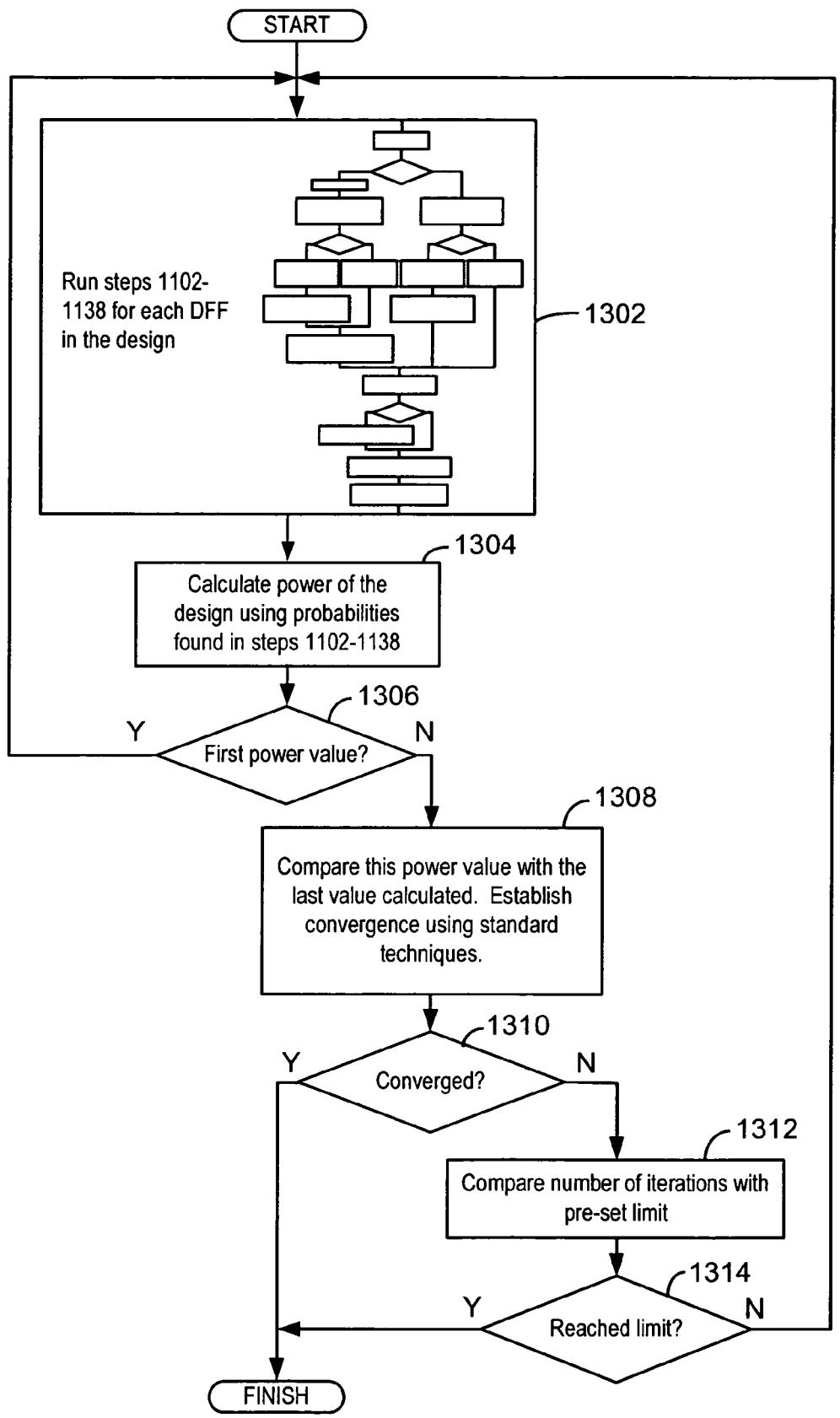
FIG. 13 shows a flowchart in which the probability updating technique shown in FIG. 11 is used to calculate an average power for a circuit, in accordance with an embodiment of the invention.

FIG. 13 shows a flowchart in which Method A is used to calculate an average power for the circuit. In general, the algorithm in FIG. 13 iterates the steps in FIG. 11 for all flops until the activity values $p_{sw}$ and $p_{hi}$ have settled down and become essentially stable. In case of pathological situations, the algorithm terminates when a set number of iterations of the steps in FIG. 11 has been reached. The flow chart in FIG. 13 is described in more detail next.

As indicated in step 1302, the steps in FIG. 11 are carried out for each flop in the design. In step 1304, a power value is obtained for the design using the activity values calculated from step 1302. If the calculated power value is the first obtained value, step 1302 is repeated, otherwise, as indicated in step 1308, the calculated power value is compared with the last calculated power value and convergence is measured using standard statistical tests. If the target convergence value is reached, the algorithm terminates, otherwise the number of iterations is compared with a pre-set limit. If the pre-set limit is reached, the algorithm terminates, otherwise the algorithm loops back to step 1302 to run the steps in FIG. 11 again.

Figure 14A:
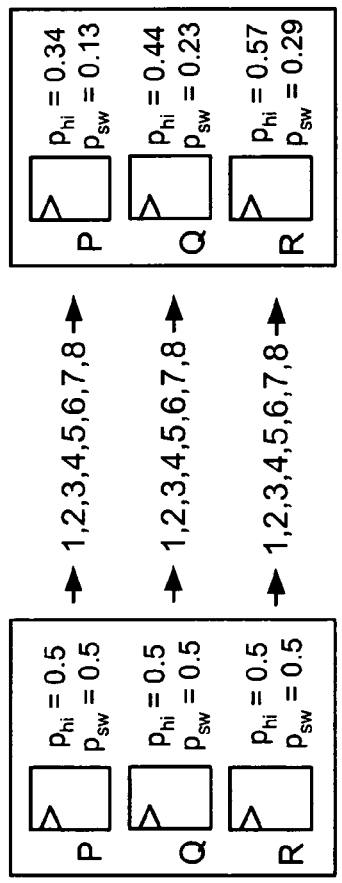
FIGS. 14A-14C show various ways the probability updating technique illustrated in FIG. 11 may be executed for each flop in a circuit.
Figure 14B:
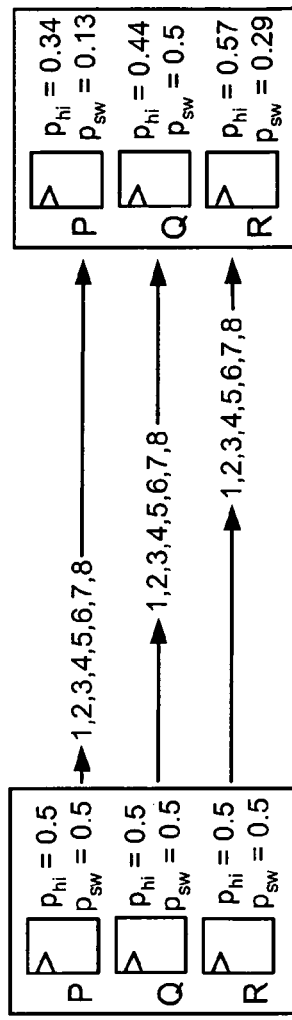
Figure 14C:
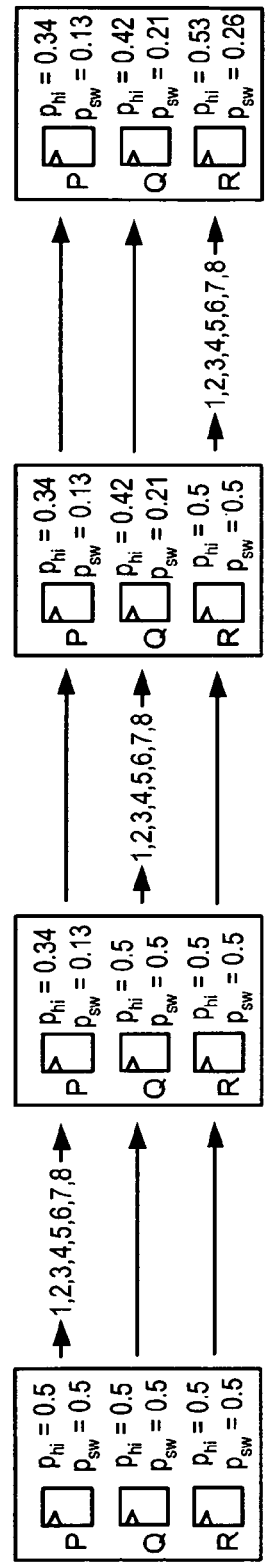

The steps in FIG. 11 may be executed for each flop in one of a number of ways. FIG. 14A shows the effect of running these steps in parallel, and FIG. 14B shows the way in which the steps would be run on a serial machine. FIG. 14B indicates that although the steps in FIG. 11 are run serially, as long as the probabilities on the flops are not updated until new values have been found for all flops, then it behaves as if the steps were run in parallel. FIG. 14C shows a method which updates the flops after each new value is found. This is a standard technique, commonly used in optimization algorithms. It often improves the speed of convergence, but may introduce an undesirable order dependence in this application (i.e., the result may depend on the order in which the flops are traversed).

V. Statistical Power Estimation Using Activity Sequences

The activity on the clock tree is more important for determining power than the rest of the circuit, because nodes on the clock tree toggle much more frequently than other nodes. But, the clock tree and logic that feeds it is typically far smaller than the rest of the circuit. It is therefore advantageous to directly simulate the clock tree, as long as this doesn't require input vectors. In accordance with an embodiment of the invention, using previously calculated probabilities, one of four simulation-like algorithms (hereinafter referred to as Methods B1, B2, C1, C2) is used to create a large number of representative short sequences of bits at important nodes, and the activity on the clock tree measured. When a sufficient number of sequences have been generated to thereby assure a high degree of confidence in the results, the total power is calculated and the algorithm terminates.

Note that the activity in a clock tree without clock gating is trivial to calculate (all nodes carry the clock at all times). Thus, Methods B1, B2, C1, C2 are only useful when calculating the activity in a clock-gated clock tree. Methods B1, B2, C1, and C2 assume that the circuit looks similar to FIG. 15. Gates involved in calculating the clock tree power have been colored gray (i.e., gates 1502-1518, 1530, and 1532 in FIG. 15). Typically, a minority of flops in the design is involved. In general, the flops in a design fall into four categories:

1. Flops that affect the state of clock gates, and are currently able to switch on a clock edge because all clock gates above them are enabled (flops 1530 and 1532 in the FIG. 15 example).
2. Flops that affect the state of clock gates, but because one or more clock gates above them are disabled at this time, cannot switch (flop 1522 in the FIG. 15 example).
3. Flops that do not affect clock gates, but can switch because clock gates above them are enabled (i.e., flops 1524, 1526, 1528, and 1534 in the FIG. 15 example).
4. Flops that do not affect clock gates, and currently cannot switch because one or more clock gate above them is disabled (flops 1518 and 1520 in the FIG. 15 example).

Figure 15:
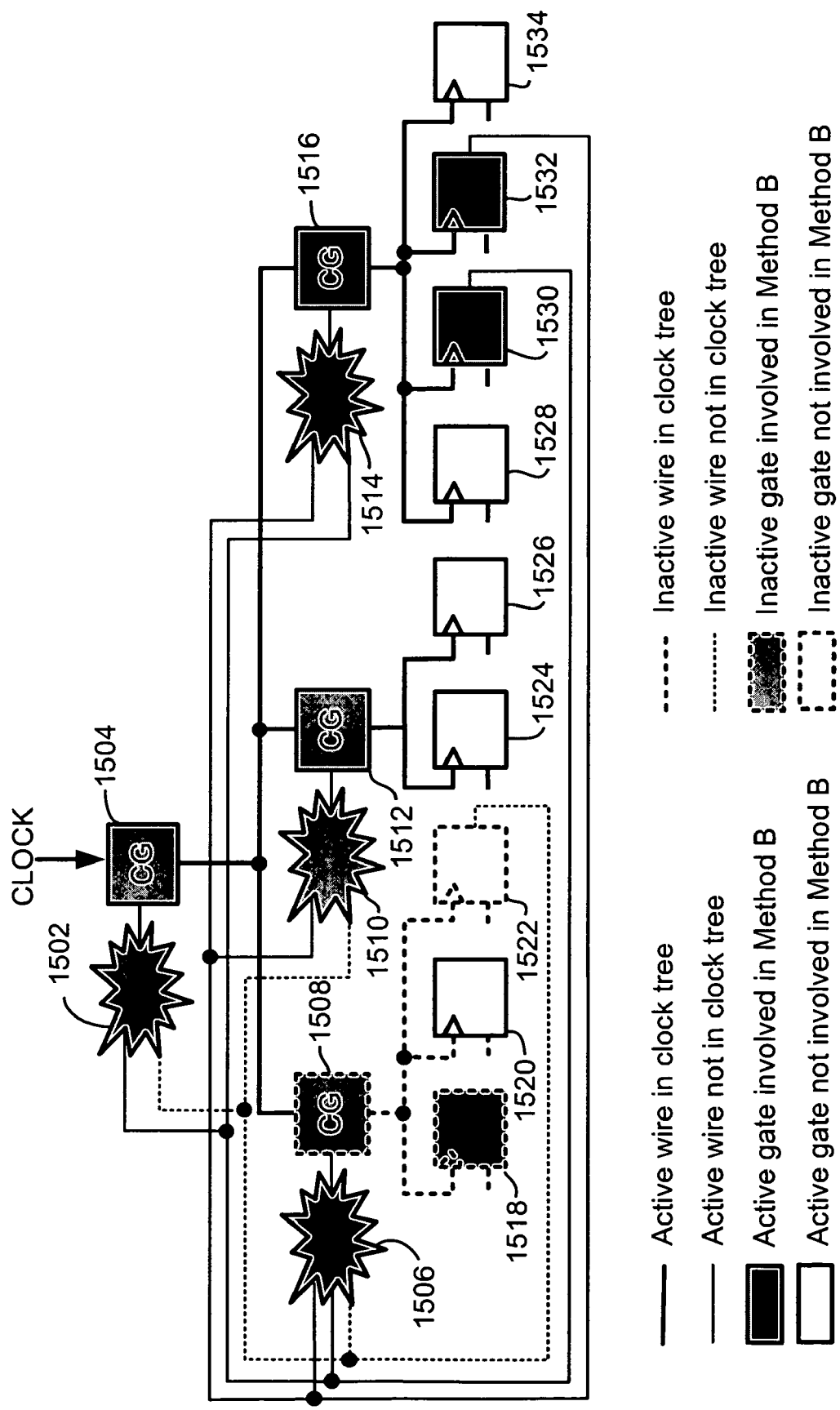
FIG. 15 shows an exemplary logic circuit used to aid in describing the various techniques illustrated in subsequent figures.

In FIG. 15, clock gate 1508 is disabled, so the three flops 1518, 1520, 1522 receiving their clock signal from clock gate 1508 cannot switch.

All four Methods B1, B2, C1, C2 create a number of sequences of typical activity, each of length k clock cycles. Each activity sequence can be used to measure power by using standard techniques (dynamic and leakage power can be calculated using library characterization data together with knowledge of the activity at every node). The average power of each of these sequences is the average power of the circuit. The four Methods B1, B2, C1, C2 use the following four procedures.

1. RandomizeInput

This procedure finds a new value for a given top-level input, using the value of $p_{hi}$ obtained from Method A. It creates a random value, such that the probability that the input is high is $p_{hi}$. This value is independent of any previous values of the input.

2. FindNewInput

This procedure looks at the old value of a top-level input, and creates a new value based on $p_{hi}$ and $p_{sw}$. The value is created in such a way that repeated application of this procedure will ensure that the long-term probability that the input is high is $p_{hi}$, and the probability that it has changed state is $p_{sw}$. This has been described in section I above.

3. RandomizeFlop

This procedure finds a new value for a flop output using the $p_{hi}$ value obtained from Method A. It creates a random value for the flop output (based on the $p_{hi}$ value) which is independent of previous values of the flop output, and has a probability of being high equal to $p_{hi}$.

4. FindNewFlop

This procedure finds a new value for a flop output, assuming the flop is clocked (that is, assuming that the master clock for this flop has a rising edge and the clock gates between the master clock and this flop are all enabled). It is based on the value of the flop output in the previous clock cycle, and the values of $p_{sw}$ and $p_{hi}$ for the flop output. The FindNewFlop procedure includes the steps of:

Find a value for $p_{ckQ}$, which is the probability that the flop output will change if the flop is clocked. This can be approximated as $q_{sw}/e$, where $q_{sw}$ is the value of $p_{sw}$ for the flop output, and e is the value of $p_{en}$ on the clock input to the flop, calculated from Method A.

Using the value of $p_{hi}$ for the flop output and $p_{ckQ}$ instead of $p_{sw}$, use the techniques in Section I to calculate a new value for the output of the flop.

The advantage of picking new values on flops when they are enabled independently of their D input is that "dead" or "error" states are unlikely to occur, and the circuit can get itself back out of them if they do occur. Contrast this with a simulation, where an erroneous state could persist for an arbitrary amount of time, making the results inaccurate.

Methods B1, B2, C1, C2 are described next. In general, each of the four methods creates values of power (P) by creating an Activity Sequence of length k, and finding the power that would be taken by the nodes in that sequence that switch. Successive values of P are added to a list, and standard statistical techniques used to determine whether the average value of P is known to a certain degree of confidence. The estimated power of the circuit is this final average value of all the P values in the list.

A. Method B1

Method B1 gives accurate results on the clock tree without consuming much time, because only a small part of the circuit is simulated. The results of Method A are used on the datapath. The flow chart in FIG. 16A will be used to describe method B1. In step 1602, the total energy E is set equal to 0. In step 1604, RandomizeInputs is called on each top-level input, and in step 1606, RandomizeFlops is called on each flop in the circuit. The order of these two steps is not critical, and thus may be reversed. Next, k iterations of steps 1610-1618 are carried out, where k is a user-specified variable. In one embodiment, k has a default value of 10.

In step 1610, using the current values at the flop outputs and top-level inputs which are used to create enable values for clock gates, the clock gates that are currently enabled (clock gates 1504, 1512, and 1516 in the FIG. 15 example) and those which are not (clock gate 1508 in the FIG. 15 example) are identified. In step 1612, the clock is propagated through the clock tree to determine how much energy this clock tick will take, and which flops receive the clock (flops 1524, 1526, 1528, 1530, 1532, and 1534 in the FIG. 15 example). The calculated energy is added to the total energy E.

In step 1614, for each flop that is clocked and is used when identifying clock gates that are enabled (flops 1530 and 1532 in the FIG. 15 example), the next-state of the flop is calculated using FindNewFlop. In step 1616, for each top-level input, its next state is calculated using FindNewInput. The order of steps 1614 and 1616 is not critical, and thus may be reversed. In step 1618, the amount of energy the datapath consumes is determined using $p_{sw}$ values obtained from method A, and the data path energy is added to total energy E. After the k iterations are exhausted, in step 1624, the total energy E is converted to power P using:

P=E/(kt), where t is the cycle time of the design.

In step 1626, standard statistical techniques are used to determine whether the average value of P can be known to within a given confidence limit, that is, whether the average value of P has converged. If it has, the estimated power for the circuit would be the value of P. If there is no convergence, the process is repeated.

Figure 16A:
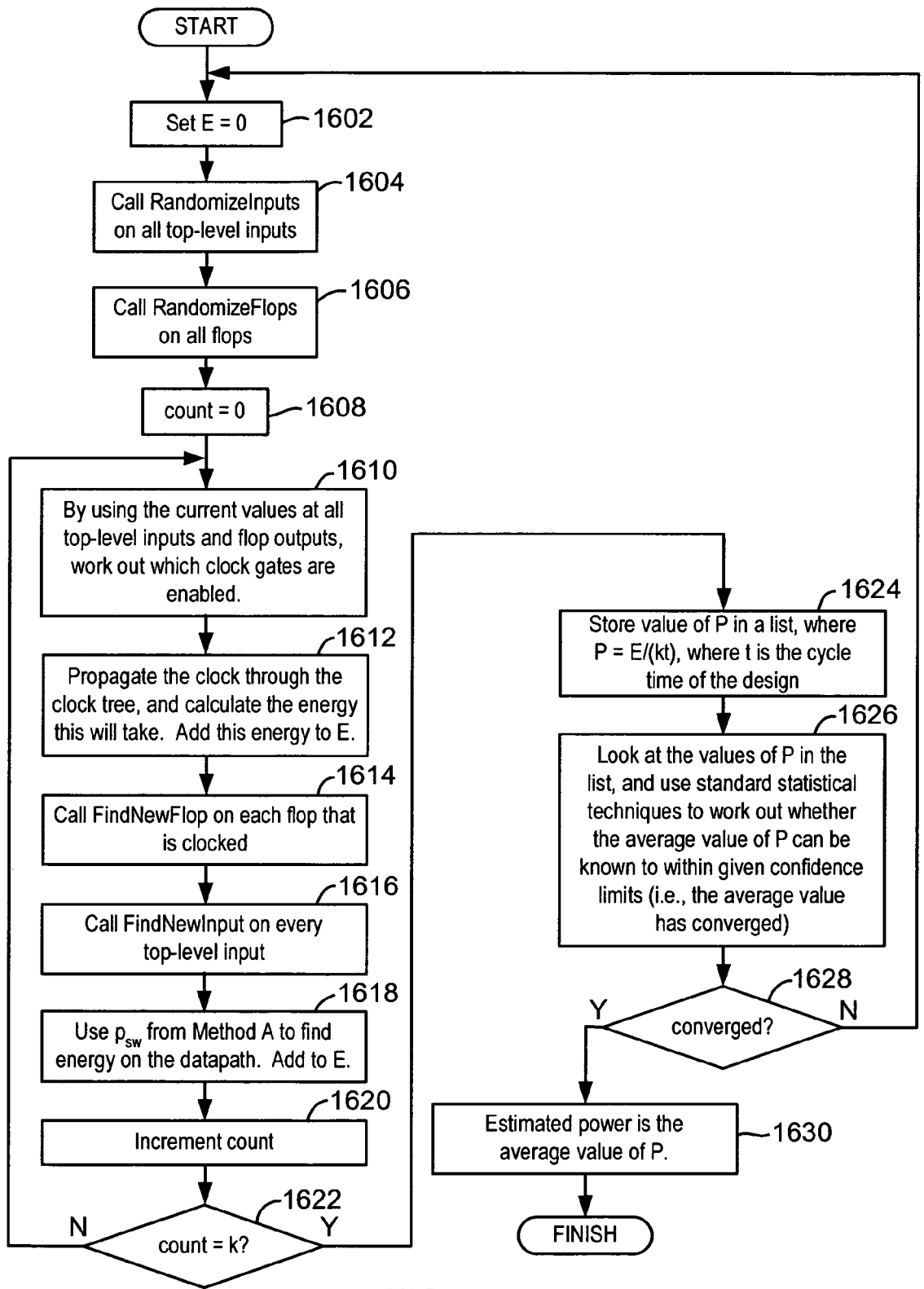
FIGS. 16A, 16B, 17, 18A, 18B, and 19 are flow charts illustrating various techniques wherein probability-based algorithms are combined with simulation-based algorithms for obtaining improved activity values in a logic circuit.
Figure 16B:
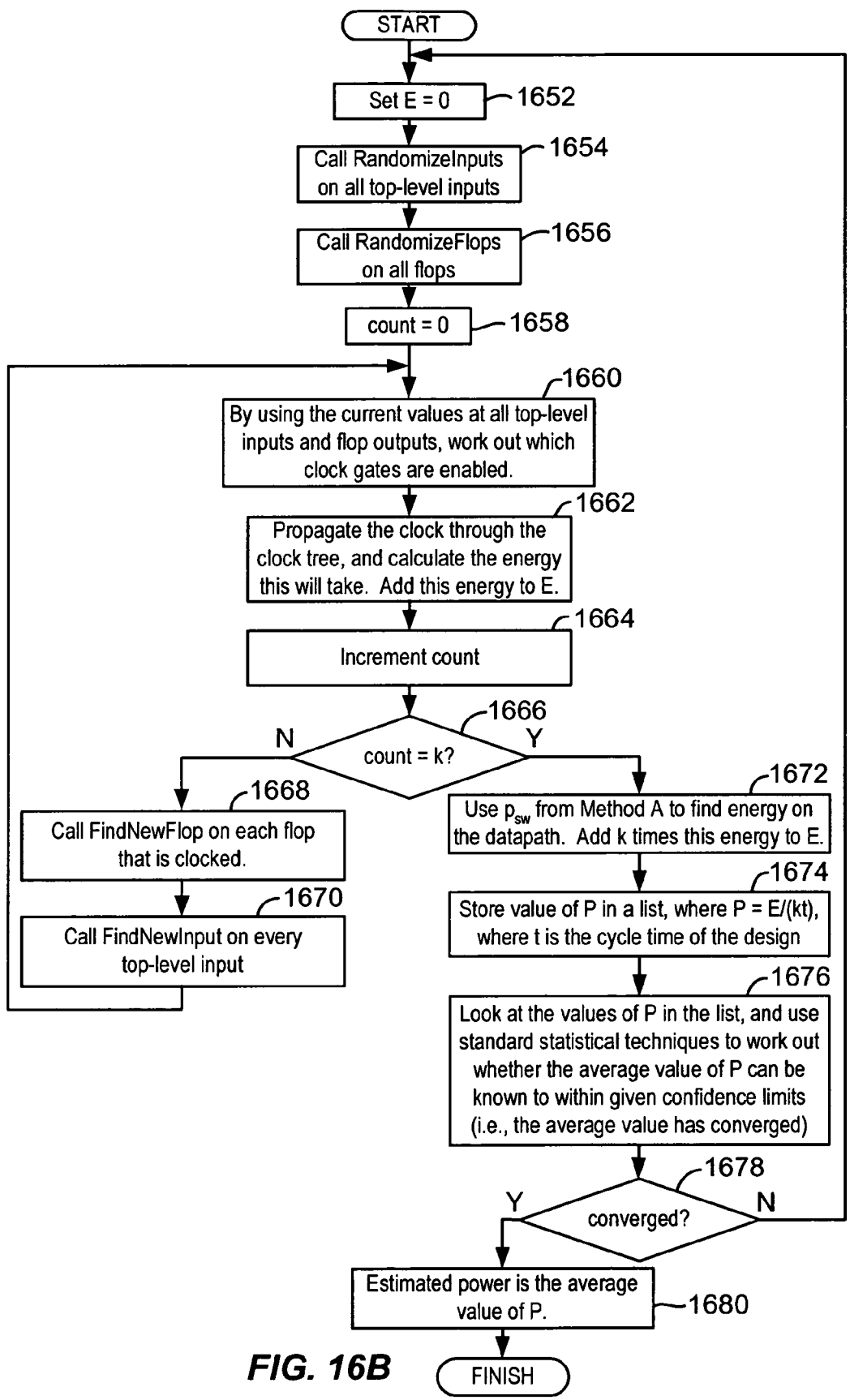

A number of the steps in FIG. 16A can be moved around without impacting the result. For example, steps 1614 and 1616 are only needed if the count is less than k, so they can be moved to the N branch of step 1622. Also, step 1618 adds the same datapath energy value every time, so it can be moved to the Y branch of the step 1622. The flowchart with these changes made is shown in FIG. 16B. While the algorithm corresponding to the FIG. 16B flow chart runs more efficiently than the one for the FIG. 16A flow chart, the FIG. 16A flow charts corresponds better to methods B2, C1, C2 described next.

B. Method B2

Method B2 is similar to method B1, except that the activity sequence is used to find the power for the whole circuit rather than just the clock tree. This is similar to simulating the whole circuit, but avoids the circuit becoming trapped in "dead" or "error" states. This also avoids the need to produce representative signals at the inputs to the circuit, and the need to set up internal state (such as register files and RAMs) before getting power measurements. This makes the method significantly easier to use than the traditional simulation approach, saving designers a significant amount of time.

Figure 17:
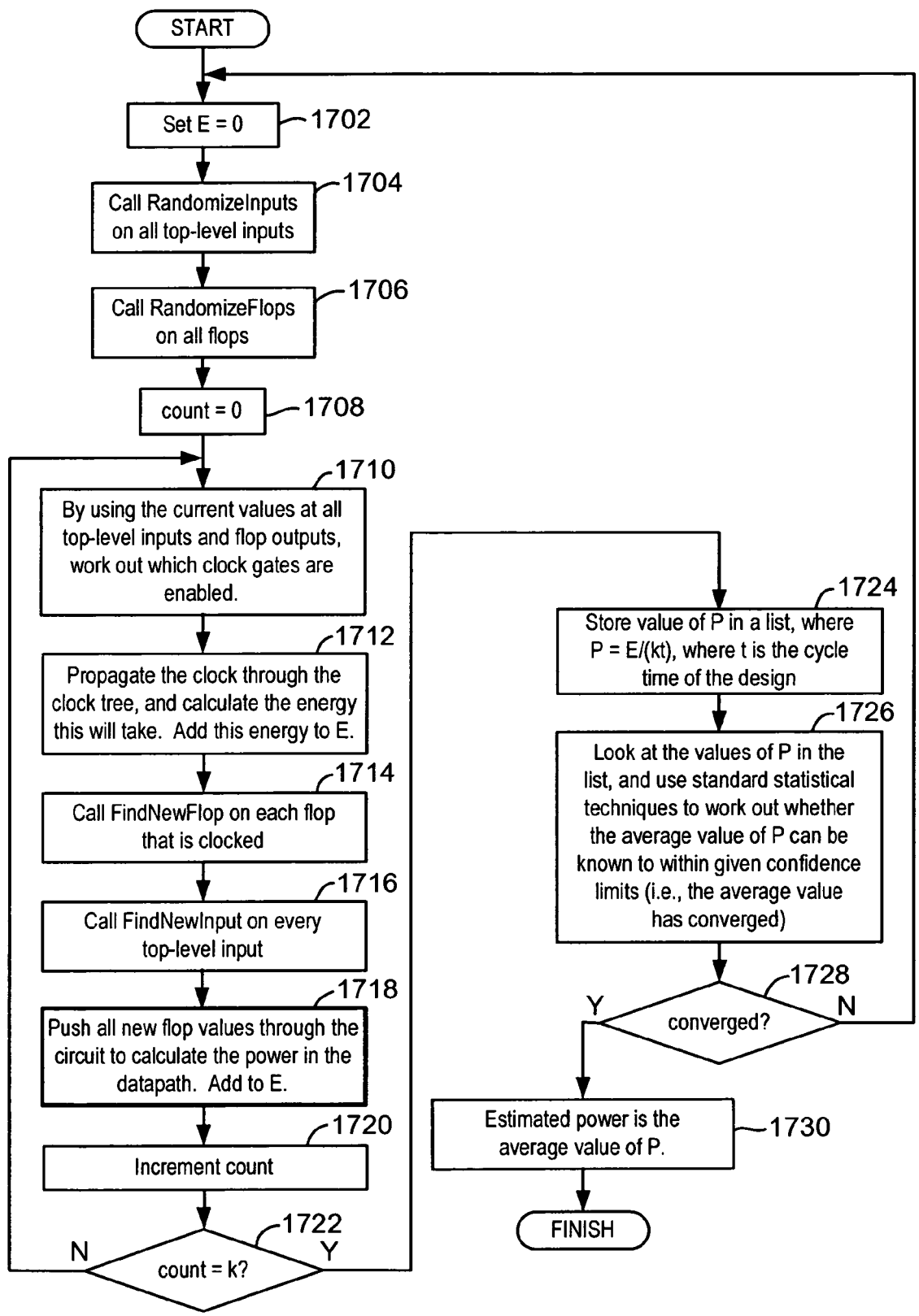

Method B2 updates the state of all flops (i.e., flops 1518-1534 in the FIG. 15 example) rather than just the flops that are used when identifying clock gates that are enabled (i.e., flops 1530 and 1532 in the FIG. 15 example). The values of the flops can then be pushed through the circuit using standard simulation techniques to find improved power values for the datapath, instead of using the probabilities calculated by Method A. This is shown in the FIG. 17 flow chart which is identical to the FIG. 16A flow chart except that step 1618 in FIG. 16A is replaced with step 1718. Instead of using the probabilities calculated from method A, the transitions are pushed through the datapath to obtain the power for the datapath.

C. Method C1

Figure 18A:
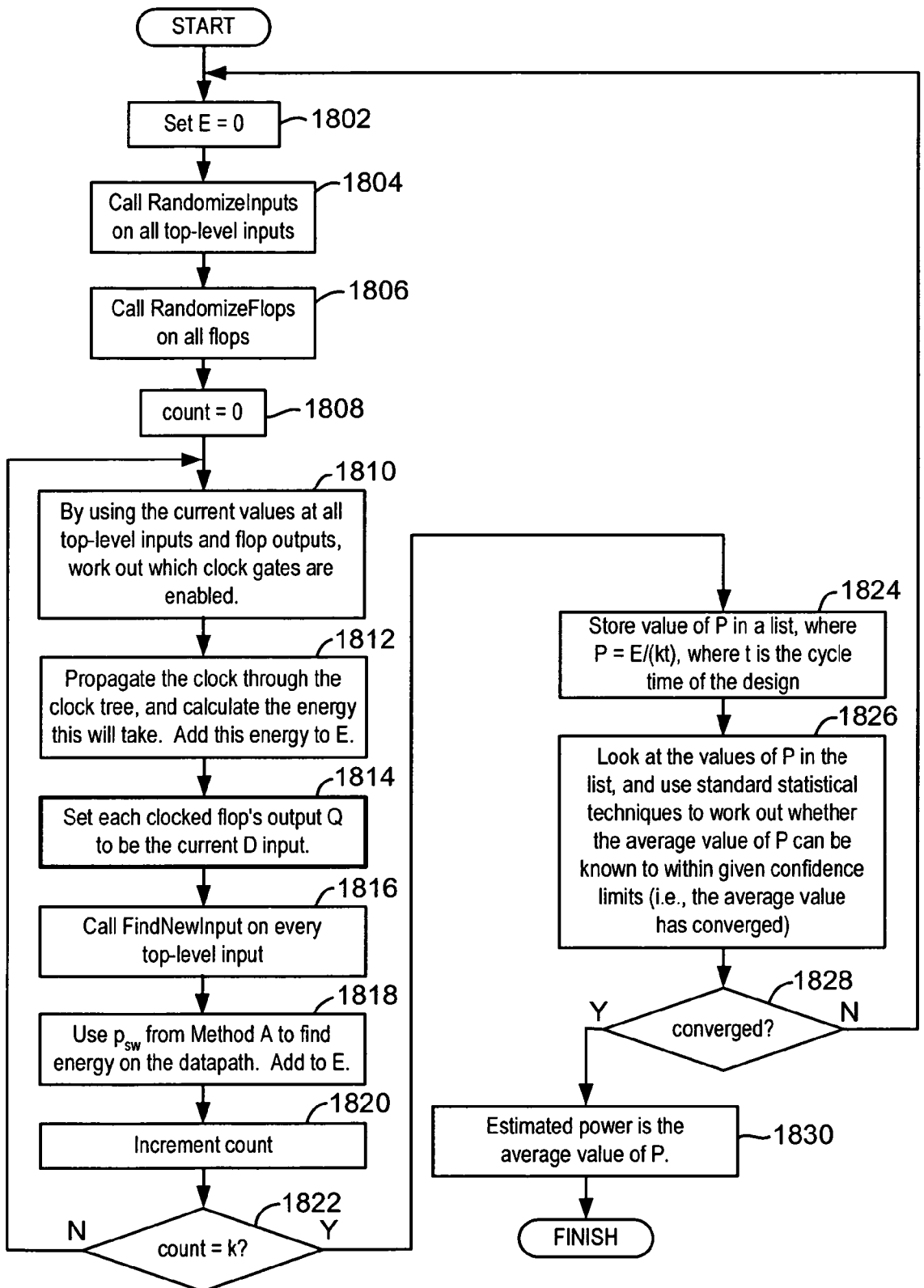

Method C1 is a variant of method B1, which gets closer to the actual behavior of the circuit, but may take longer to converge. A flow chart for method C1 is shown in FIG. 18A. Method C1 has one change from Method B1, namely, when updating a flop because it was clocked, $p_{ckQ}$ and $q_{hi}$ are not used to determine the next state randomly, but instead the next-state of flop output Q is assigned to be the current state of its D input (or the internal effective D input, if it's a complex flop). This is shown as step 1814 in the FIG. 18A flow chart which is identical to the FIG. 16A flow chart except that step 1614 in FIG. 16A is replaced with step 1814.

Figure 18B:
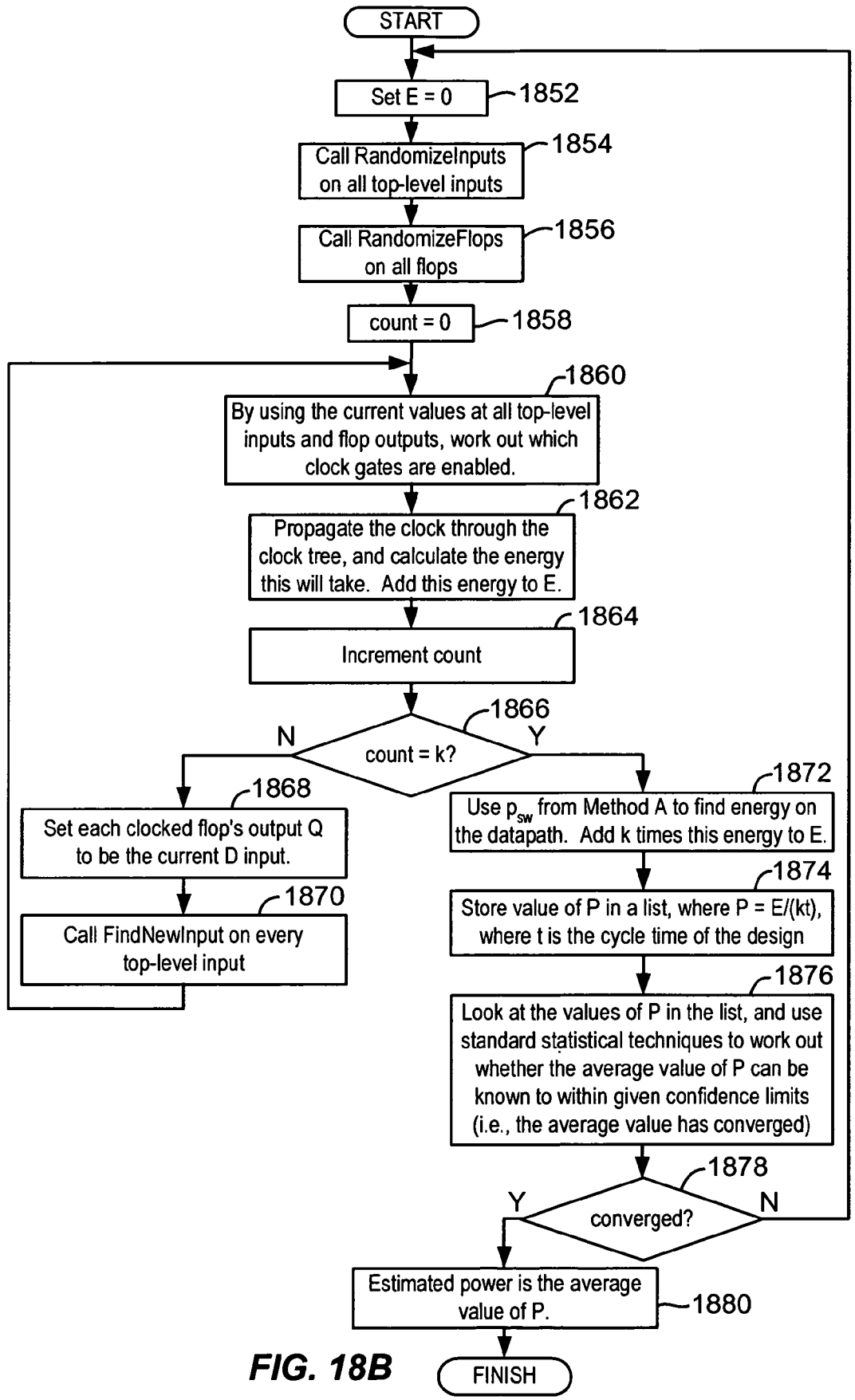

The behavior of method C1 is thus much more like a real simulation, but without the problem of needing input vectors and the problem that the simulation might get stuck. In other words, method C1 has some of the properties of a simulation, but is significantly easier for a designer to use correctly. FIG. 18B shows a variation of the FIG. 18A flow chart, which parallels the FIG. 16B variation of the FIG. 16A flow chart. That is, FIG. 18B reflects the changes where steps 1814 and 1816 in FIG. 18A are moved to the N branch of step 1822, and step 1818 in FIG. 18A is moved to the Y branch of the step 1822. As with the FIG. 16B variation of Method B1, the FIG. 18B variation of Method C1 runs more efficiently.

D. Method C2

Figure 19:
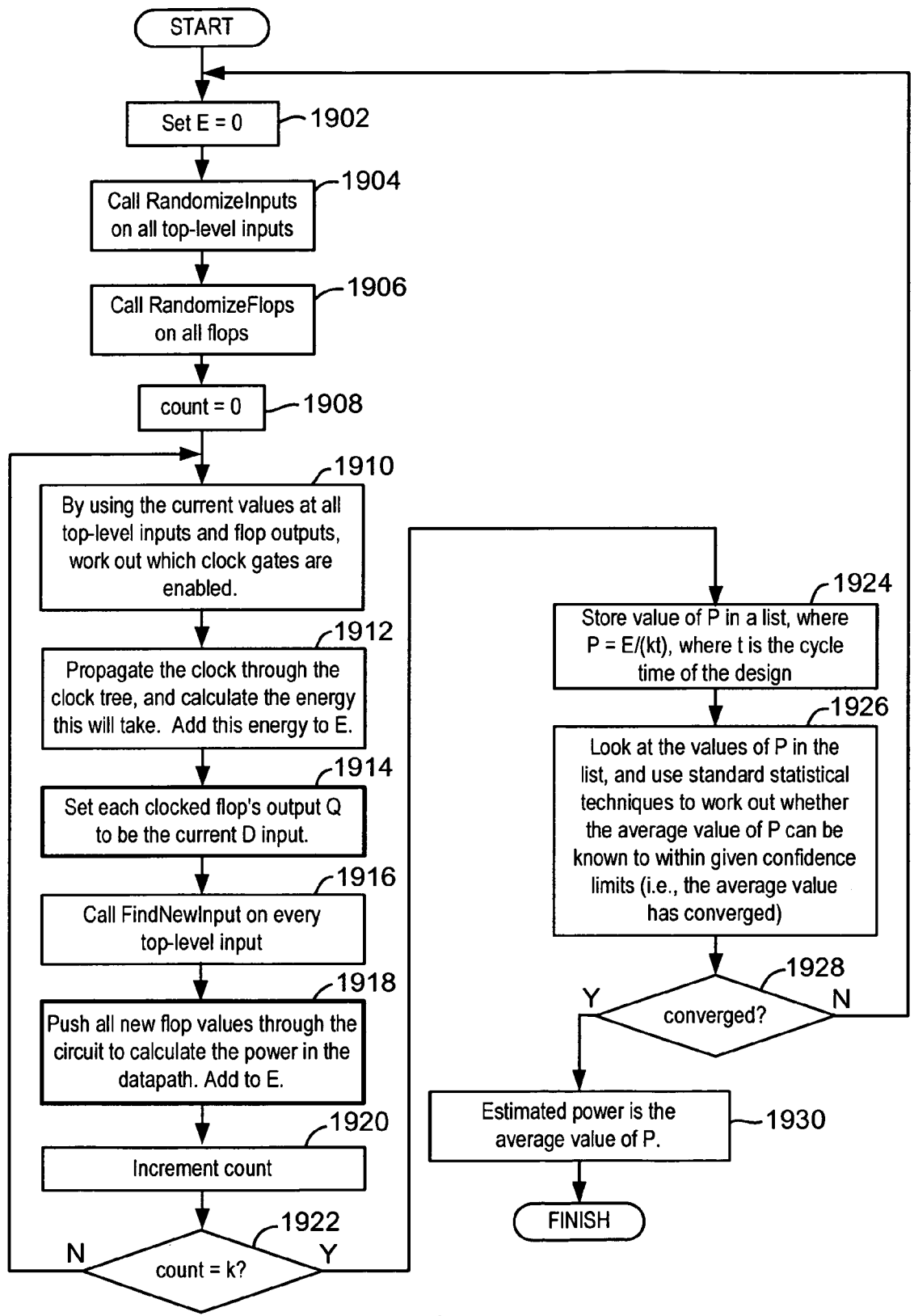

Method C2 is a variant of Method B2. Method C2 uses both the changes from Methods B2 and C1, and thus is a logical extension of Methods B1, B2, and C1. A flow chart for method C2 is shown in FIG. 19. Method C2 uses the calculated transitions to find the power on the datapath, rather than the method A data, and also passes the current D values of clocked flops to the flop output Q rather than calling FindNewFlop. These steps are shown as steps 1914 and 1918 in the FIG. 19 flow chart which is identical to the FIG. 16A flow chart except that steps 1614 and 1618 are replaced with steps 1914 and 1918.

Figure 20:
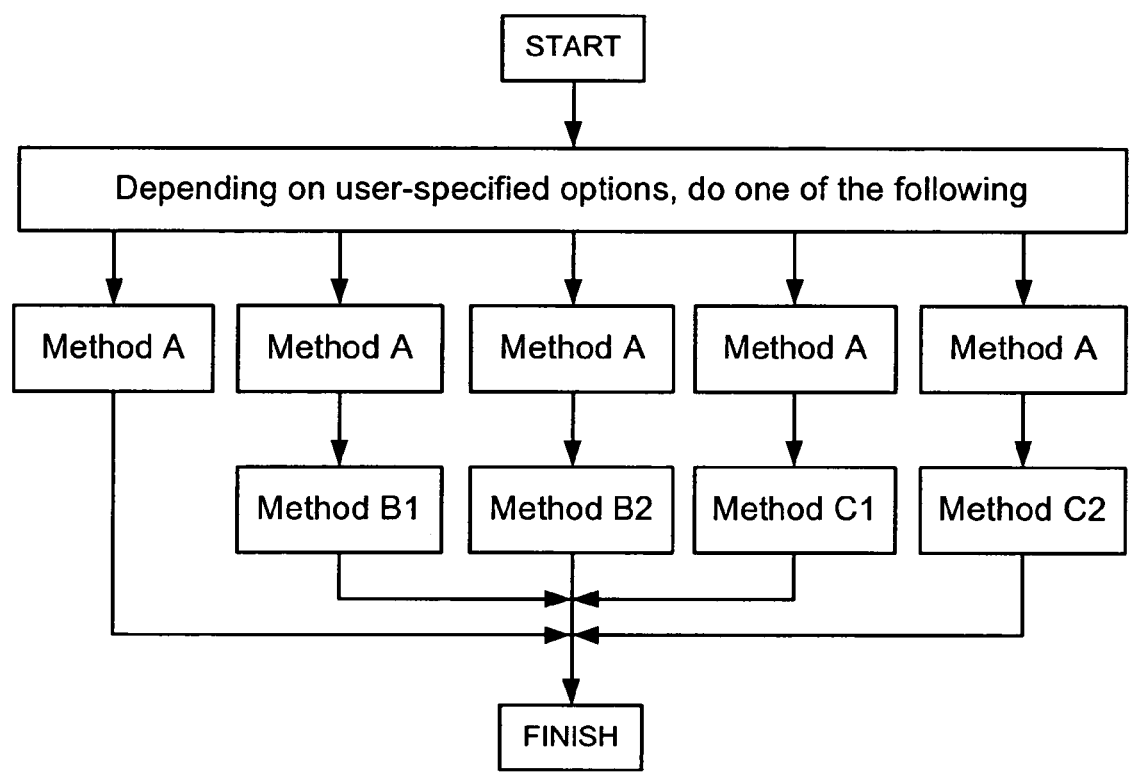
FIG. 20 illustrates how the various techniques and methods described in this disclosure may be advantageously combined to achieve the desired goals.

The various techniques and methods described above may be combined in a number of ways as illustrated in FIG. 20. Depending on user-specified criteria, one of a number of options is possible:

1. Method A only
2. Methods A and B1
3. Methods A and B2
4. Methods A and C1
5. Methods A and C2

In options 2-4, Method A is used to generate statistical information about the circuit, and then one of Methods B1, B2, C1 and C2 uses that information to create a number of short Activity Sequences, which have their power measured and hence give an estimated power value for the circuit. As indicated by option 1, it is possible to generate a power estimate from Method A directly (FIG. 13).

While, the above techniques are described mostly in the context of average-case activity estimation for digital circuits, a number of applications where these techniques can be advantageously used are outlined below.

A first application is estimation of dynamic power in CMOS digital circuits. If the information about how often all nodes in the circuit switch is known, then you can calculate the average-case dynamic power of the circuit. A second application is estimation of leakage power for CMOS digital circuits. Among the information generated by the algorithms described herein is the probability that each node is high. These probabilities can be used, together with the state-dependent leakage power tables that exist in almost all modern cell libraries, to obtain good estimates of the leakage power of the design.

A third application is estimation of total power for non-CMOS digital designs. By finding the probability of switching and the probability of being high, the algorithms described herein gather enough data to calculate the power of the design even on non-CMOS processes, such as the NMOS MESFET processes typically used with GaAs. A fourth application is power-driven routing and placement. The switching probabilities generated by the algorithms in this disclosure can be used to weight the wire lengths for power-driven routers and placement engines, leading to lower chip power.

A fifth application is use of the algorithms in this disclosure in tackling power rail integrity issues. The switching probabilities calculated by these algorithms can be used to find the expected supply rail current, which in turn can be used to find IR drop and determine whether the supply rails are adequate.

Figure 21:
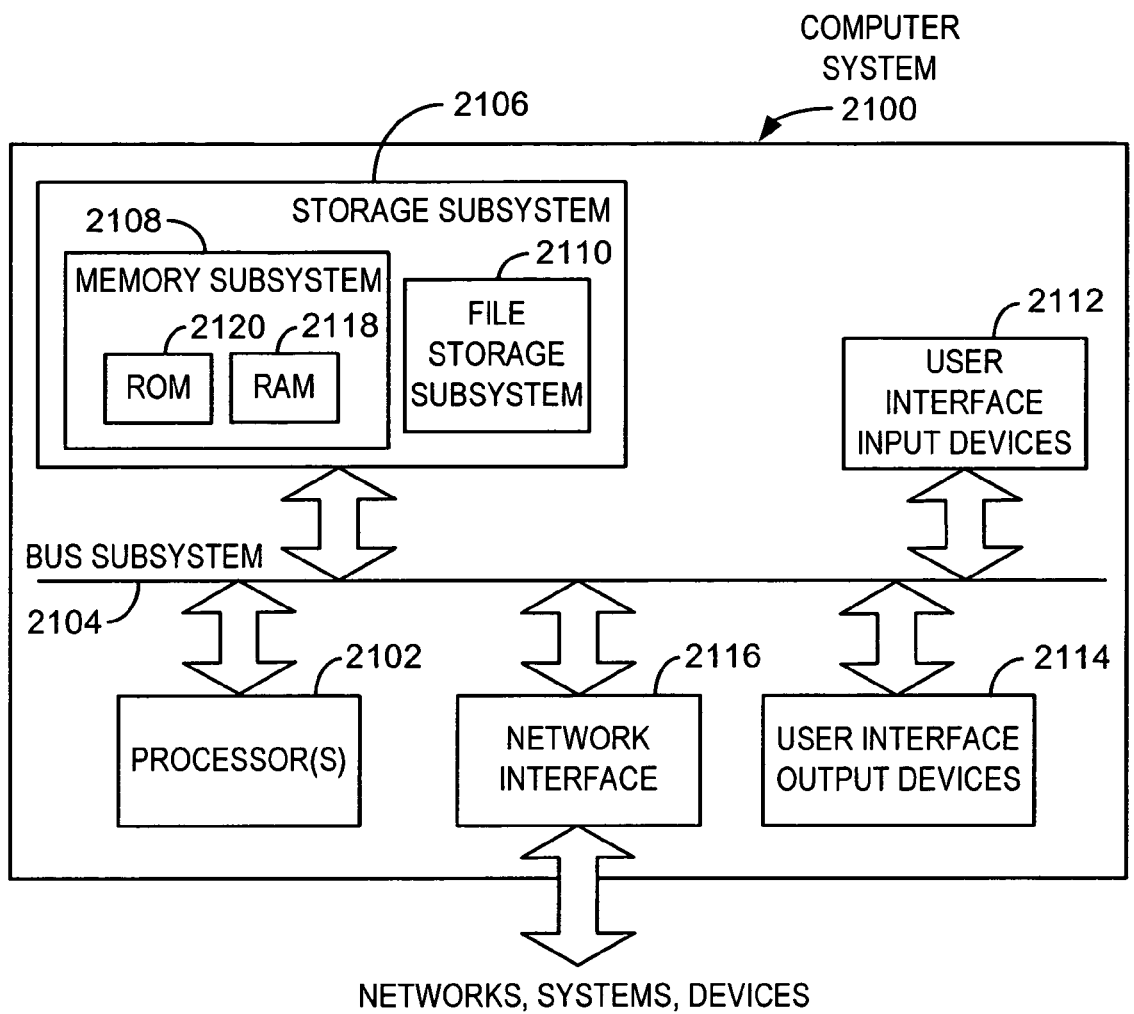
FIG. 21 is a simplified block diagram of a computer system that may be used to practice the embodiments of the present invention.

FIG. 21 is a simplified block diagram of a computer system 2100 that may be used to practice the embodiments of the present invention. As shown in FIG. 21, computer system 2100 includes a processor 2102 that communicates with a number of peripheral devices via a bus subsystem 2104. These peripheral devices may include a storage subsystem 2106, comprising a memory subsystem 2108 and a file storage subsystem 2110, user interface input devices 2112, user interface output devices 2114, and a network interface subsystem 2116.

Bus subsystem 2104 provides a mechanism for letting the various components and subsystems of computer system 2100 communicate with each other as intended. Although bus subsystem 2104 is shown schematically as a single bus, alternative embodiments of the bus subsystem may utilize multiple busses.

Network interface subsystem 2116 provides an interface to other computer systems, networks, and devices. Network interface subsystem 2116 serves as an interface for receiving data from and transmitting data to other systems from computer system 2100.

User interface input devices 2112 may include a keyboard, pointing devices such as a mouse, trackball, touchpad, or graphics tablet, a scanner, a barcode scanner, a touchscreen incorporated into the display, audio input devices such as voice recognition systems, microphones, and other types of input devices. In general, use of the term "input device" is intended to include all possible types of devices and mechanisms for inputting information to computer system 2100.

User interface output devices 2114 may include a display subsystem, a printer, a fax machine, or non-visual displays such as audio output devices, etc. The display subsystem may be a cathode ray tube (CRT), a flat-panel device such as a liquid crystal display (LCD), or a projection device. In general, use of the term "output device" is intended to include all possible types of devices and mechanisms for outputting information from computer system 2100.

Storage subsystem 2106 may be configured to store the basic programming and data constructs that provide the functionality of the present invention. Software (code modules or instructions) that provides the functionality of the present invention may be stored in storage subsystem 2106. These software modules or instructions may be executed by processor(s) 2102. Storage subsystem 2106 may also provide a repository for storing data used in accordance with the present invention. Storage subsystem 2106 may comprise memory subsystem 2108 and file/disk storage subsystem 2110.

Memory subsystem 2108 may include a number of memories including a main random access memory (RAM) 2118 for storage of instructions and data during program execution and a read only memory (ROM) 2120 in which fixed instructions are stored. File storage subsystem 2110 provides persistent (non-volatile) storage for program and data files, and may include a hard disk drive, a floppy disk drive along with associated removable media, a Compact Disk Read Only Memory (CD-ROM) drive, an optical drive, removable media cartridges, and other like storage media.

Computer system 2100 can be of various types including a personal computer, a portable computer, a workstation, a network computer, a mainframe, a kiosk, or any other data processing system. Due to the ever-changing nature of computers and networks, the description of computer system 2100 depicted in FIG. 21 is intended only as a specific example for purposes of illustrating the preferred embodiment of the computer system. Many other configurations having more or fewer components than the system depicted in FIG. 21 are possible.

In one embodiment, the various algorithms described herein are stored in file storage subsystem 2210. A netlist representation of a circuit is produced by a combination of the actions of user interface input devices 2212 and other algorithms stored in file storage subsystem 2210, and the netlist representation is also stored in storage subsystem 2210. Specific commands entered by the user causes the processor to execute one or more of the algorithms described herein on the netlist. The results of the algorithms are either provided to the user directly via user interface output devices 2214, or are provided to other algorithms stored in the file storage subsystem 2210 or in the RAM 2218.

Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Additionally, although the present invention has been described using a particular series of steps, it should be apparent to those skilled in the art that the scope of the present invention is not limited to the described series of steps.

Further, while the present invention has been described using a particular combination of hardware and software, it should be recognized that other combinations of hardware and software are also within the scope of the present invention.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

What is claimed is:

1. A method for estimating the average-case activity in a digital circuit, the method comprising:
   assigning initial activity values to outputs of flops in the digital circuit; and
   repeatedly updating the activity values in an iterative procedure until a predetermined termination criterion is met,
   wherein the updating of the activity values uses:
      stochastically derived predetermined formulae for predesignated types of circuit elements when a search in the iterative procedure finds any one of the predesignated types of circuit elements, wherein:
         the predesignated types of circuit elements include at least one of a flop with a recirculation multiplexer coupled to an input of the flop, a clock gated flop or an enable flop,
         the predetermined formulae are used to calculate the activity values at an output of the predesignated types of circuit elements using the activity values at inputs of the predesignated types of circuit elements, and
         the predetermined formulae are based on a stationary distribution of a Markov chain that is associated with the predesignated types of circuit elements, and
      probability propagation techniques for combinational logic elements that are not predesignated types of circuit elements when the search finds any one of the combinational logic elements in the digital circuit.

2. The method of claim 1 wherein a user can specify activity values at any top-level input of the digital circuit, and any output of a circuit element in the digital circuit, and the specified activity values are used in preference to the activity values obtained by the iterative procedure.

3. The method of claim 1 wherein the predesignated types of circuit elements are flops with a recirculation multiplexer coupled to an input of the flop.

4. The method of claim 1 wherein the predesignated types of circuit elements are clock gated flops.

5. The method of claim 1 wherein the predesignated types of circuit elements are enable flops.

6. The method of claim 1 wherein the termination criterion comprises:
   comparing a first result obtained at the end of one iterative procedure with a second result at the end of the previous iterative procedure; and
   terminating the updating of the activity values if any one of three conditions is met: (i) the first and second results are substantially similar, (ii) a predesignated time limit lapses, and (iii) a predesignated number of iterations in the iterative process is reached.

7. The method of claim 1, wherein the predetermined formulae are the same for the clock-gated flop, the enable flop and the flop with a recirculation multiplexer coupled to an input of the flop.

8. A computer system configured to store a plurality of instructions for controlling a data processor to estimate the average-case activity in a digital circuit, wherein the plurality of instructions comprise:
   instructions that cause the data processor to assign initial activity values to outputs of flops in the digital circuit; and
   instructions that cause the data processor to repeatedly update the activity values in an iterative procedure until a predetermined termination criterion is met,
   wherein the updating of the activity values uses:
      stochastically derived predetermined formulae for predesignated types of circuit elements when a search in the interactive procedure finds any one of the predesignated types of circuit elements, wherein:
         the predesignated types of electrical circuit elements include at least one of a flop with a recirculation multiplexer coupled to an input of the flop, a clock gated flop or an enable flop,
         the predetermined formulae are used to calculate the activity values at an output of the predesignated types of circuit elements using the activity values at inputs of the predesignated types of circuit elements, and
         the predetermined formulae are based on a stationary distribution of a Markov chain that is associated with the predesignated types of circuit elements, and
      probability propagation techniques for combinational logic elements that are not predesignated types of circuit elements when the search finds any one of the combinational logic elements in the digital circuit.

9. The computer system of claim 8 wherein a user can specify activity values at any top-level input of the digital circuit, and any output of a circuit element in the digital circuit, and the specified activity values are used in preference to the activity values obtained by the iterative procedure.

10. The computer system of claim 8 wherein the predesignated types of circuit elements are flops with a recirculation multiplexer coupled to an input of the flop.

11. The computer system of claim 8 wherein the predesignated types of circuit elements are clock gated flops.

12. The computer system of claim 8 wherein the predesignated types of circuit elements are enable flops.

13. The computer system of claim 8 further comprising:
instructions that cause the data processor to compare a first result obtained at the end of one iterative procedure with a second result at the end of the previous iterative procedure; and
instructions that cause the data processor to terminate the updating of the activity values if any one of three conditions is met: (i) the first and second results are substantially similar, (ii) a predesignated time limit lapses, and (iii) a predesignated number of iterations in the iterative process is reached.

14. The computer system of claim 8, wherein the predetermined formulae are the same for the clock-gated flop, the enable flop and the flop with a recirculation multiplexer coupled to an input of the flop.

15. A method for estimating the average-case activity in a digital circuit, the method comprising:
assigning initial activity values to outputs of flops in the digital circuit; and
repeatedly updating the activity values in an iterative procedure until a predetermined termination criterion is met,
wherein the updating of the activity values uses:
stochastically derived predetermined formulae for predesignated types of circuit elements when a search in the iterative procedure finds any one of the predesignated types of circuit elements, wherein:
the predesignated types of circuit elements comprise state machine nodes, and
the predetermined formulae are used to calculate activity values at an output of the predesignated types of circuit elements using the activity values at inputs of the predesignated types of circuit elements, and
probability propagation techniques for combinational logic elements that are not predesignated types of circuit elements when the search finds any one of the combinational logic elements in the digital circuit; and
searching for a feedback path from the output of a flop to either an input of a recirculation multiplexer through logic, if a recirculation multiplexer was found during the iterative procedure, or a D input of the flop, if no recirculation multiplexer was found and the flop has a D input.

16. The method of claim 15 wherein a user can specify activity values at any top-level input of the digital circuit, and any output of a circuit element in the digital circuit, and the specified activity values are used in preference to the activity values obtained by the iterative procedure.

17. The method of claim 15 wherein the termination criterion comprises:
comparing a first result obtained at the end of one iterative procedure with a second result at the end of the previous iterative procedure; and
terminating the updating of the activity values if any one of three conditions is met: (i) the first and second results are substantially similar, (ii) a predesignated time limit lapses, and (iii) a predesignated number of iterations in the iterative process is reached.

18. A computer system configured to store a plurality of instructions for controlling a data processor to estimate the average-case activity in a digital circuit, wherein the plurality of instructions comprise:
instructions that cause the data processor to assign initial activity values to outputs of flops in the digital circuit; and
instructions that cause the data processor to repeatedly update the activity values in an iterative procedure until a predetermined termination criterion is met,
wherein the updating of the activity values uses:
stochastically derived predetermined formulae for predesignated types of circuit elements when a search in the interactive procedure finds any one of the predesignated types of circuit elements, wherein:
the predesignated types of circuit elements comprise state machine nodes, and
the predetermined formulae are used to calculate activity values at an output of the predesignated types of circuit elements using the activity values at inputs of the predesignated types of circuit elements, and
probability propagation techniques for combinational logic elements that are not predesignated types of circuit elements when the search finds any one of the combinational logic elements in the digital circuit; and
searching for a feedback path from the output of a flop to either an input of a recirculation multiplexer through logic, if a recirculation multiplexer was found during the iterative procedure, or a D input of the flop, if no recirculation multiplexer was found and the flop has a D input.

19. The computer system of claim 18 wherein a user can specify activity values at any top-level input of the digital circuit, and any output of a circuit element in the digital circuit, and the specified activity values are used in preference to the activity values obtained by the iterative procedure.

20. The computer system of claim 18 further comprising:
instructions that cause the data processor to compare a first result obtained at the end of one iterative procedure with a second result at the end of the previous iterative procedure; and
instructions that cause the data processor to terminate the updating of the activity values if any one of three conditions is met: (i) the first and second results are substantially similar, (ii) a predesignated time limit lapses, and (iii) a predesignated number of iterations in the iterative process is reached.

* * * * *